US012804277B2

(12) United States Patent

Lim

(10) Patent No.: US 12,804,277 B2

(45) Date of Patent: Nov. 17, 2026

(54) IMAGE SENSOR AND DRIVING METHOD THEREOF

(71) Applicant: Samsung Electronics Co., Ltd., Suwon-si (KR)

(72) Inventor: Jungwook Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 32 days.

(21) Appl. No.: 19/001,744

(22) Filed: Dec. 26, 2024

(65) Prior Publication Data

US 2025/0294264 A1 Sep. 18, 2025

(30) Foreign Application Priority Data

Mar. 12, 2024 (KR) ........................ 10-2024-0034730

(51) Int. Cl.

| | |
|---|---|
| ***H04N 25/59*** | (2023.01) |
| ***H04N 25/771*** | (2023.01) |
| ***H10F 39/00*** | (2025.01) |
| ***H10F 39/18*** | (2025.01) |

(52) U.S. Cl.

CPC ........... *H04N 25/59* (2023.01); *H04N 25/771* (2023.01); *H10F 39/182* (2025.01); *H10F 39/80373* (2025.01)

(58) Field of Classification Search

CPC ...... H04N 25/59; H04N 25/77; H04N 25/771; H10F 39/182; H10F 39/80373

See application file for complete search history.

(56) References Cited

U.S. PATENT DOCUMENTS

| | | | | |
|---|---|---|---|---|
| 10,714,517 | B2 | 7/2020 | Lee et al. | |
| 11,496,700 | B1 | 11/2022 | Elizov et al. | |
| 11,678,086 | B2 | 6/2023 | Nakamura | |
| 11,830,894 | B2 | 11/2023 | Kudo | |
| 2019/0229138 | A1 | 7/2019 | Lee et al. | |
| 2021/0274119 | A1 | 9/2021 | Nakamura | |
| 2022/0037386 | A1 | 2/2022 | Ikakura | |
| 2022/0272289 | A1* | 8/2022 | Oh | H04N 25/585 |
| 2022/0345648 | A1 | 10/2022 | Elizov et al. | |
| 2023/0076177 | A1 | 3/2023 | Lim et al. | |
| 2023/0207584 | A1 | 6/2023 | Kudo | |
| 2023/0224608 | A1 | 7/2023 | Lim | |
| 2024/0363654 | A1* | 10/2024 | Lee | H10F 39/8037 |
| 2025/0097594 | A1* | 3/2025 | Lee | H04N 25/42 |

FOREIGN PATENT DOCUMENTS

| | | |
|---|---|---|
| KR | 1020220145783 A | 10/2022 |

* cited by examiner

*Primary Examiner* — Kelly L Jerabek

(74) *Attorney, Agent, or Firm* — Muir Patent Law, PLLC

(57) ABSTRACT

An image sensor according an embodiment includes a first photoelectric element, a first floating diffusion in which charges generated in the first photoelectric element are stored, a second floating diffusion in which charges generated in the first photoelectric element are stored, a first transfer gate with one end connected to the first floating diffusion and the other end connected to the first photoelectric element, a first capacitor connected to the first floating diffusion, and a pixel including a second transfer gate with one end connected to the second floating diffusion and the other end connected to the first photoelectric element. In addition, the image sensor includes a row driver that applies a first control signal to the first transfer gate and a second control signal to the second transfer gate.

20 Claims, 17 Drawing Sheets

800

1000

1100

1300

1600

1700

IMAGE SENSOR AND DRIVING METHOD THEREOF

CROSS-REFERENCE TO RELATED APPLICATION

This application claims priority and the benefit thereof under 35 U.S.C. § 119 to Korean Patent Application No. 10-2024-0034730, filed in the Korean Intellectual Property Office on Mar. 12, 2024, the entire contents of which are incorporated herein by reference.

BACKGROUND

(a) Field of the Invention

The present disclosure relates to an image sensor and a driving method of the image sensor.

(b) Description of Related Art

Image sensors are devices that capture a two-dimensional or three-dimensional image of objects. Image sensors generate images of objects by using photoelectric conversion elements that react according to the intensity of light reflected from the objects. With the recent development of complementary metal-oxide semiconductor (CMOS) technology, CMOS image sensors using CMOS are widely used.

Recently, in order to increase the dynamic range of an image sensor, an image sensor including a plurality of photoelectric elements with different sensitivities has been developed. However, even if the image sensor includes a plurality of photoelectric elements, there is an issue that there is a limit to the increase in dynamic range.

SUMMARY

An embodiment relates to an image sensor and a driving method of the image sensor to increase dynamic range.

An image sensor according to an embodiment for solving the technical object includes a first photoelectric element, a first floating diffusion in which charges generated in the first photoelectric element are stored, a second floating diffusion in which charges generated in the first photoelectric element are stored, a first transfer gate with one end connected to the first floating diffusion and the other end connected to the first photoelectric element, a first capacitor connected to the first floating diffusion, and a pixel including a second transfer gate with one end connected to the second floating diffusion and the other end connected to the first photoelectric element. In addition, the image sensor includes a row driver that applies a first control signal to the first transfer gate and a second control signal to the second transfer gate.

A pixel provided within an image sensor according to an embodiment includes a first region that receives photo charges generated in a first photoelectric element through a first transfer gate, a first capacitor that receives the photo charges from the first region through a first contact connected to the first region, a second region that receives the photo charges generated in the first photoelectric element through a second transfer gate, a third region that receives the photo charges from the second region through a second contact connected to the second region, a reset transistor connected to one end of the third region and a gain control transistor connected to the other end of the third region, and a fourth region that receives photo charges generated in the second photoelectric element through a third transfer gate connected to the gain control transistor.

A driving method of an image sensor according to an embodiment includes transmitting photo charges generated from a second photoelectric element to a first node, generating a first pixel signal in response to the voltage of the first node, transmitting photo charges generated from a first photoelectric element to the first node, generating a second pixel signal in response to the voltage of the first node, transmitting the stored photo charges from a first capacitor storing the photo charges overflowing from the first photoelectric element to the first node, and generating a third pixel signal in response to the voltage of the first node.

DETAILED DESCRIPTION OF THE EMBODIMENTS

Figure 1:
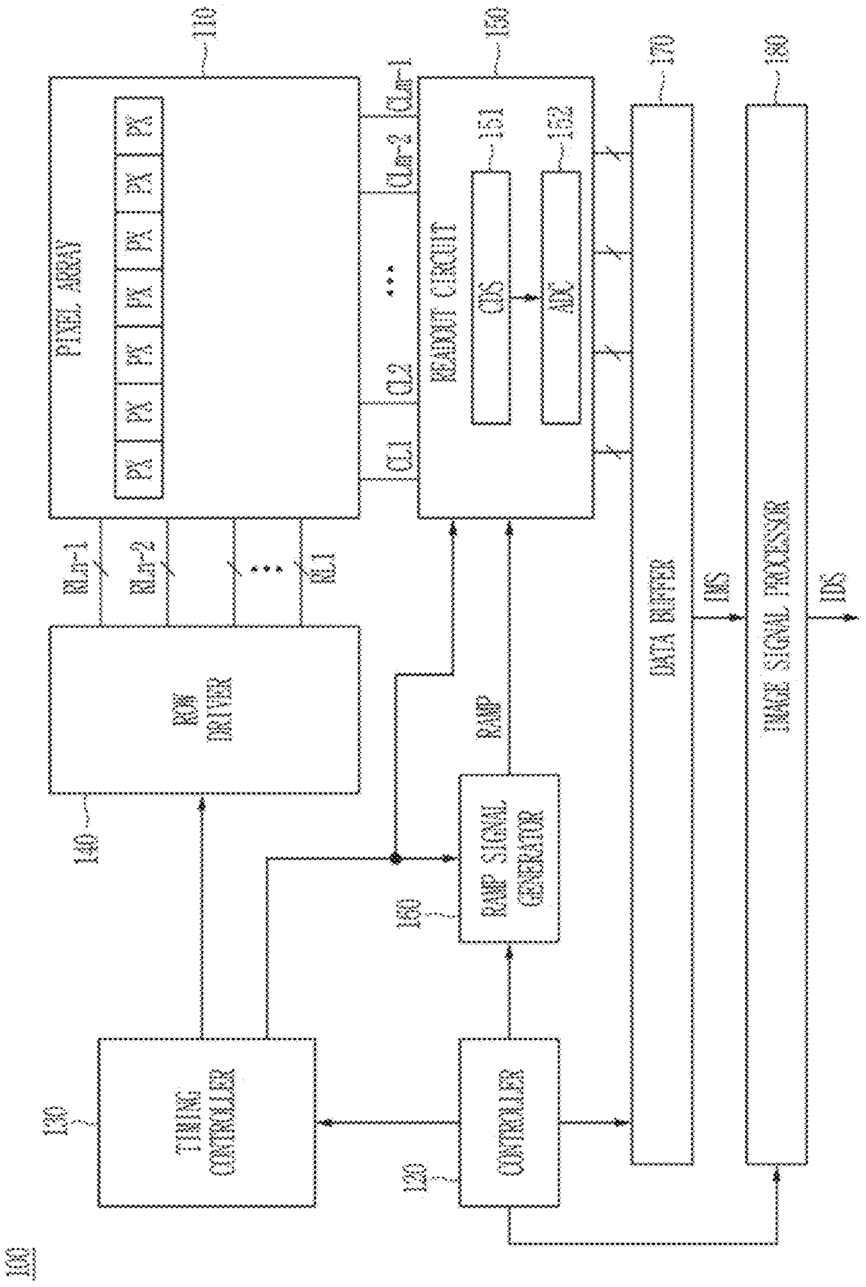
FIG. 1 is a block diagram illustrating an image sensor according to an example embodiment.

In the following detailed description, only certain exemplary embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. In the flowchart described with reference to drawings in this description, the operation order may be changed, several operations may be merged, certain operations may be divided, and specific operations may not be performed.

In the description, expressions described in the singular in this specification may be interpreted as the singular or plural unless an explicit expression such as "one" or "single" is used. While terms including ordinal numbers, such as "first" and "second," etc., may be used to describe various components, such components are not limited to the above terms. These terms are only used to distinguish one constituent element from another constituent element.

Hereinafter, the present disclosure will be described in more detail through examples. These examples are merely for illustrating the present disclosure, and the scope of rights protection of the present disclosure is not limited by these examples.

FIG. 1 is a block diagram illustrating an image sensor according to an example embodiment.

As shown in FIG. 1, an image sensor 100 according to an embodiment may include a pixel array 110, a controller 120, a timing controller 130, a row driver 140, a readout circuit 150, a ramp signal generator 160, a data buffer 170, and an image signal processor 180. In some embodiments, the image signal processor 180 may be disposed external to image sensor 100.

The image sensor 100 may generate an image signal (IMS) by converting light received from the outside into an electric signal. The image signal (IMS) may be provided to the image signal processor 180.

The image sensor 100 may be mounted on an electronic device having an image or light sensing function. For example, the image sensor 100 may be mounted in electronic devices such as cameras, smartphones, wearable devices, internet of things (IoT) devices, home appliances, tablet personal computers (PCs), personal digital assistants (PDAs), portable multimedia players (PMPs), navigation, drones, and advanced driver assistance systems (ADAS). The image sensor 100 may be mounted on electronic devices that are included as components in vehicles, furniture, manufacturing facilities, doors, and various measuring devices.

The pixel array 110 may include a plurality of pixels PX, a plurality of row lines RL1, RL2, . . . , RLn−1 and a plurality of column lines CL1, CL2, . . . , CLm−1 respectively connected to the plurality of pixels PX. The pixel PX may include a photoelectric element (or photo-sensing element) and at least one floating diffusion node (FD). A photoelectric element may detect incident light and generate photo charges. The photo charges generated by the photoelectric element may be transmitted to the floating diffusion node.

The photoelectric element may detect incident light and convert the incident light into an electric signal according to the light density, that is, a plurality of analog pixel signals. The level of the analog pixel signal output from the photoelectric element may increase as the amount of photo charges output from the photoelectric element increases. For example, the level of the analog pixel signal output from the photoelectric element may increase as the amount of light received into the pixel array 110 increases.

In some embodiments, the plurality of pixels PX may each include a plurality of photoelectric elements and a plurality of floating diffusion nodes. The plurality of photoelectric elements may include a first photoelectric element having a first light-receiving area and a second photoelectric element having a second light-receiving area different from the first light-receiving area. The amount of photo charges generated by the photoelectric element and the level of the analog pixel signal output from the photoelectric element may be proportional to the light-receiving area of the photoelectric element. Each of the plurality of floating diffusion nodes may receive photo charges generated from the plurality of photoelectric elements.

The timing at which photo charges generated from the plurality of photoelectric elements and analog pixel signals output from the plurality of photoelectric elements are respectively transmitted to the plurality of floating diffusion nodes may be different. For example, after the photo charges generated from the second photoelectric element and the analog pixel signal output from the second photoelectric element are transmitted to the plurality of floating diffusion nodes, the photo charges generated from the first photoelectric element and the analog pixel signal output from the first photoelectric element may be transmitted to the plurality of floating diffusion nodes.

The analog pixel signal output from the photoelectric element may be transmitted to the readout circuit 150. The timing at which the analog pixel signals output from each of the plurality of photoelectric elements are transmitted to the readout circuit 150 may be different. For example, after the analog pixel signal output from the second photoelectric element is transmitted to the readout circuit 150, the analog pixel signal output from the first photoelectric element may be transmitted to the readout circuit 150. Details related to this will be described in FIG. 7.

The plurality of row lines RL1, RL2, . . . , RLn−1 extend in a first direction and may be connected to pixels PX arranged along the first direction. The plurality of column lines CL1, CL2, . . . , CLm−1 extend in a second direction crossing the first direction and may be connected to pixels PX arranged along the second direction. The plurality of column lines CL1, CL2, . . . , CLm−1 may transmit pixel signals output from the pixels PX to the readout circuit 150.

The controller 120 may generally control each component (e.g., the pixel array 110, the timing controller 130, the row driver 140, the readout circuit 150, the ramp signal generator 160, the data buffer 170, and the image signal processor 180) included in the image sensor 100. The controller 120 may control the operation timing of each component (e.g., the pixel array 110, the timing controller 130, the row driver 140, the readout circuit 150, the ramp signal generator 160, the data buffer 170, and the image signal processor 180) using control signals.

In some embodiments, the controller 120 may control the ramp signal generator 160 to adjust the reference signal RAMP generated by the ramp signal generator 160. In some embodiments, the controller 120 may control the timing controller 130 to adjust the capacitance of the floating diffusion node of each pixel PX through the row driver 140. In some embodiments, the controller 120 may control the timing controller 130 to adjust the operation timing of elements in the pixel array 110 through the row driver 140.

The timing controller 130 may generate a signal that serves as a standard for operation timing of components of the image sensor 100. The timing controller 130 may control the timing of the row driver 140, the readout circuit 150, and the ramp signal generator 160. The timing controller 130 may provide control signals that control the timing of the row driver 140, the readout circuit 150, and the ramp signal generator 160.

The timing controller 130 may control the timing of elements within the pixel PX in the reset section, integration section, and readout section. The reset section may be a section in which charges accumulated in floating diffusion nodes within the pixel PX are reset. The integration section may be a section in which a photoelectric element is exposed to light to generate photo charges and the generated photo charges are transmitted to floating diffusion nodes. The readout section may be a section in which voltages of floating diffusion nodes are transmitted to the readout circuit 150.

The row driver 140 may generate a control signal for driving the pixel array 110 in response to a control signal from the timing controller 130, and provide the control signal to a plurality of pixels PX of the pixel array 110 through a plurality of row lines RL1, RL2, . . . , RLn−1. In some embodiments, the row driver 140 may control the pixel PX to sense incident light on a row line basis. A row line unit may include at least one row line RL1, RL2, . . . , RLn−1.

The readout circuit 150 may receive pixel signals output from a plurality of pixels PX from the column lines CL1, CL2, . . . , CLm−1. The readout circuit 150 may convert the pixel signal (or electric signal) from pixels PX connected to row lines RL1, RL2, . . . , RLn−1 selected from among the plurality of pixels PX in response to a control signal from the timing controller 130 into a pixel PX value representing the light density. The readout circuit 150 may include a correlated double sampling (CDS) circuit 151 and an analog digital converter (ADC) circuit 152.

The CDS circuit 151 may include a plurality of comparators, and each of the comparators may compare the pixel signal received from the pixel array 110 through a plurality of column lines CL1, CL2, . . . , CLm−1 with the reference signal RAMP from the ramp signal generator 160. Specifically, the CDS circuit 151 may compare the received pixel signal with the reference signal RAMP and output the comparison result to the ADC circuit 152.

The plurality of pixel signals output from the plurality of pixels PX may have deviations due to inherent characteristics of each pixel PX (e.g., fixed pattern noise (FPN), etc.) and/or deviations due to differences in the characteristics of the pixel PX circuit for outputting the pixel signals from the pixels PX (e.g., transistors for outputting charge stored in photoelectric conversion elements within the pixels PX).

In order to compensate for the deviation between a plurality of pixel signals output through the plurality of column lines CL1, CL2, . . . , CLm−1, obtaining a reset component (e.g., reset voltage) and a sensing component (e.g., sensing voltage) for the pixel signal and extracting the difference (e.g., the difference between the reset voltage and the sensing voltage) as a valid signal component is called correlated double sampling. For example, to compensate for the deviation between a plurality of pixel signals output through the plurality of column lines CL1, CL2, . . . , CLm−1, correlated double sampling is performed by extracting the difference between the reset voltage and the sensing voltage. The CDS circuit 151 may output a comparison result in which a correlated double sampling technique is applied to the received pixel signal.

The ADC circuit 152 may generate and output pixel PX values corresponding to a plurality of pixels PX on a row-by-row basis by converting the comparison result of the CDS circuit 151 into digital data. The ADC circuit 152 may include a plurality of counters. The counter may be implemented as an up-counter and an operation circuit whose count value sequentially increases based on a counting clock signal, an up/down counter, or a bit-wise inversion counter.

A plurality of counters may be connected to the output of each of a plurality of comparators. Each of the plurality of counters may count a comparison result output from a corresponding comparator and output digital data (e.g., a pixel PX value) according to the counting result.

The ramp signal generator 160 may generate a reference signal RAMP and transmit it to the readout circuit 150. The ramp signal generator 160 may include a current source, a resistor, and a capacitor. The ramp signal generator 160 may generate a plurality of ramp signals that decrease or increase in slope depending on the current size of the variable current source or the resistance value of the variable resistor, by adjusting the ramp voltage applied to the ramp resistance by adjusting the current size of the variable current source or the resistance value of the variable resistor.

The data buffer 170 may store pixel PX values of a plurality of pixels PX connected to the selected column lines CL1, CL2, . . . , CLm−1 transmitted from the readout circuit 150. The data buffer 170 may output the stored pixel PX value as an image signal IMS to the image signal processor 180 in response to an enable signal from the controller 120.

The image signal processor 180 may perform image signal processing on the image signal IMS received from the data buffer 170. For example, the image signal processor 180 may receive a plurality of image signals IMS from the data buffer 170 and synthesize the received image signals IMS to generate image data IDS.

Figure 2:
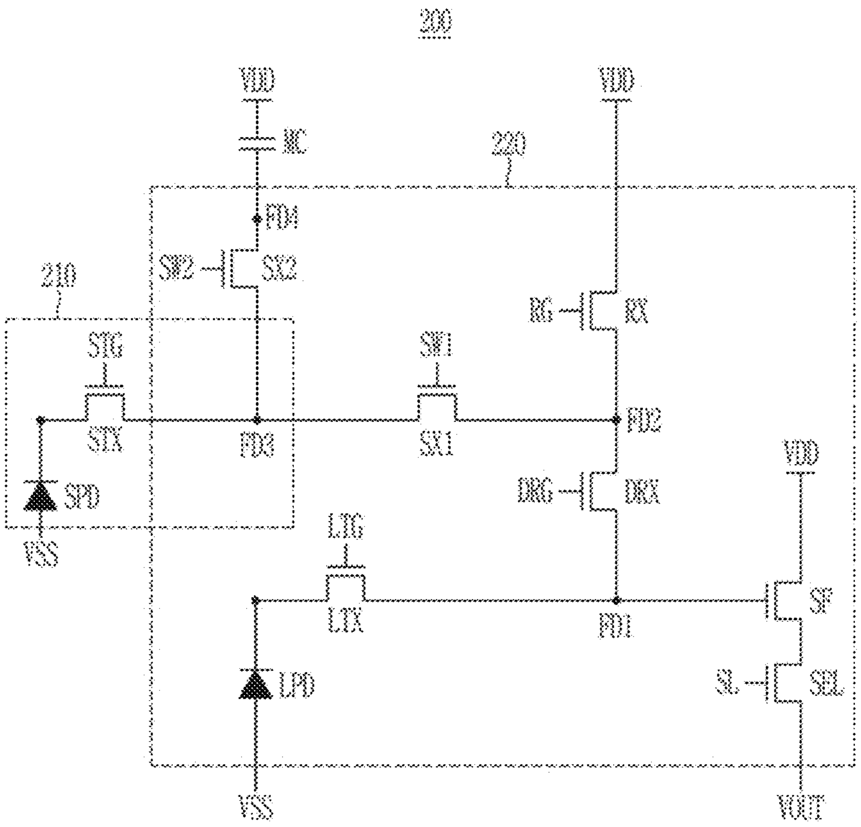
FIG. 2 is a circuit diagram of a pixel PX according to an example.

FIG. 2 is a circuit diagram of a pixel PX according to an example.

Specifically, FIG. 2 is a circuit diagram of the pixel PX of FIG. 1. Referring to FIG. 2, the pixel PX 200 may include a first circuit 210 and a second circuit 220. The first circuit 210 has low international standard organization (ISO) sensitivity and may be used in a high-illuminance environment. Compared to the first circuit 210, the second circuit 220 has higher ISO sensitivity and may be used in a low-illuminance environment.

When the first circuit 210 and the second circuit 220 are included together in the pixel PX, the image sensor may flexibly respond to changes in light density as compared to when only one of the first circuit 210 and the second circuit 220 is included in the pixel PX. The first circuit 210 operates in a high-illuminance environment, and the second circuit 220 operates in a low-illuminance environment, so that an image signal based on changes in light density of a wide range may be generated. Accordingly, the dynamic range, which is the range from the brightest part of the image to the darkest part, may be expanded.

The first circuit 210 and the second circuit 220 may be disposed on the same layer. The first circuit 210 and the second circuit 220 may be connected through a third floating diffusion node FD3. Specifically, the third floating diffusion node FD3 included in the first circuit 210 and the third floating diffusion node FD3 included in the second circuit 220 may be connected through a contact (not shown). This will be described later with reference to FIG. 3.

The first circuit 210 may include a first photoelectric element SPD, and the second circuit 220 may include a second photoelectric element LPD. The light-receiving areas of the first photoelectric element SPD and the second photoelectric element LPD may be different. For example, the first photoelectric element SPD may have a smaller light-receiving area than the second photoelectric element LPD. The full well capacity (FWC) of the second photoelectric element LPD, which has a larger light-receiving area, may be higher than that of the first photoelectric element SPD. Each of the first photoelectric element SPD and the second photoelectric element LPD may be connected to a source voltage VSS (e.g., a ground voltage).

When the light density flowing into the first photoelectric element SPD and the second photoelectric element LPD increases to a certain level or higher, it is possible to reach a saturated state where no current is generated from the first photoelectric element SPD and the second photoelectric element (LPD) anymore. When the same light density flows into the first photoelectric element SPD and the second photoelectric element LPD, the second photoelectric element LPD, which has a larger light-receiving area, may reach saturated state faster than the first photoelectric element SPD. Accordingly, the first photoelectric element SPD may operate in higher illuminance environment than the second photoelectric element LPD.

The size of the first photoelectric element SPD may be significantly smaller than the size of the second photoelectric element LPD. For example, the size of the first photoelectric element SPD may be smaller than about 1 μm, and the size of the second photoelectric element LPD may be about 2 to 4 μm. Considering the sizes of the first photoelectric element SPD and the second photoelectric element LPD, the first circuit 210 may be smaller in size than the second circuit 220.

The first circuit 210 may include only a first transfer gate STX. Photo charges generated in the first photoelectric element SPD may be stored in the third floating diffusion node FD3 through the first transfer gate STX. In order to expand the contact area between the first transfer gate STX and the first photoelectric element SPD, the first transfer gate STX may be a vertical transfer gate VTG.

In some embodiments, the first transfer gate STX may be configured as a dual vertical transfer gate D-VTG that integrates two VTGs. In the case of a D-VTG, photo charge transmission performance is improved compared to a single VTG, thereby improving the voltage control ability of the first transfer gate STX. In this disclosure, the description will be made assuming that the first transfer gate STX is composed of a D-VTG.

The first transfer gate STX may be connected between the first photoelectric element SPD and the third floating diffusion node FD3. The first transfer gate STX may be controlled by a first control signal STG. In some embodiments, the first control signal STG may be generated in the row driver (e.g., row driver 140 in FIG. 1) based on the control of the timing controller (e.g., timing controller 130 in FIG. 1).

The first transfer gate STX, which receives the first control signal STG, may control the movement of photo charges from the first photoelectric element SPD to the third floating diffusion node FD3 like a switch. When the first transfer gate STX is turned on, the charge generated in the first photoelectric element SPD may be transmitted to the third floating diffusion node FD3.

The second circuit 220 may include a second transfer gate LTX, a gain control transistor DRX, a driving transistor SF, a selection transistor SEL, a reset transistor RX, a first switch transistor SX1, and a second switch transistor SX2.

Photo charges generated in the second photoelectric element LPD may be stored in a first floating diffusion node FD1 through the second transfer gate LTX. In order to increase the contact area between the second transfer gate LTX and the second photoelectric element LPD, the second transfer gate LTX may be a VTG.

The second transfer gate LTX may be connected between the second photoelectric element LPD and the first floating diffusion node FD1. The second transfer gate LTX may be controlled by the second control signal LTG. In some embodiments, the second control signal LTG may be generated in the row driver 140 based on control of the timing controller 130.

The second transfer gate LTX, which receives the second control signal LTG, may control the movement of photo charges from the second photoelectric element LPD to the first floating diffusion node FD1 like a switch. When the second transfer gate LTX is turned on, the charge generated in the second photoelectric element LPD may be transmitted to the first floating diffusion node FD1.

The gain control transistor DRX may be connected between the first floating diffusion node FD1 and the second floating diffusion node FD2. The gain control transistor DRX may be controlled by a gain control signal DRG. When the gain control transistor DRX is turned on, the first floating diffusion node FD1 and the second floating diffusion node FD2 are connected to increase capacitance, and the conversion gain, which is the rate at which charge is converted to voltage, may decrease. In other words, when the conversion gain transistor DRX is turned on, the conversion gain transistor DRX may operate in low conversion gain (LCG) mode.

Conversely, when the conversion gain transistor DRX is turned off, the conversion gain transistor DRX may operate in high conversion gain (HCG) mode.

According to some embodiments, the second photoelectric element LPD may generate pixel signals corresponding to dual conversion gain (DCG) through the gain control transistor DRX. Specifically, the gain control transistor DRX is turned on or off according to the gain control signal DRG, so that pixel signals corresponding to the gain control signal DRG may be generated for the second photoelectric element LPD.

The gate of the driving transistor SF may be connected to the first floating diffusion node FD1. The first terminal of the driving transistor SF may be connected to the selection transistor SEL, and a driving voltage VDD may be applied to the second terminal. The driving transistor SF may operate as a source-follower amplifier for the voltage of the first floating diffusion node FD1. The driving transistor DX may be turned on in response to the voltage of the first floating diffusion node FD1.

The selection transistor SEL may be connected to the first terminal of the driving transistor SF and one of the plurality of column lines CL1, CL2, . . . , CLm−1 and may be controlled by the selection control signal SL. When the selection transistor SEL is turned on, a pixel voltage VOUT output from the driving transistor SF may be output to the readout circuit (e.g., readout circuit 150 in FIG. 1) through one of the plurality of column lines CL1, CL2, . . . , CLm−1 connected to the selection transistor SEL. For example, when the selection transistor SEL is turned on in a readout operation, a pixel signal including a reset signal corresponding to a reset operation or an image signal corresponding to a charge accumulation operation may be output through one of the plurality of column lines CL1, CL2, . . . , CLm−1.

The reset transistor RX may be connected between the power voltage line supplying the power supply voltage VDD and the second floating diffusion node FD2. The reset transistor RX may be controlled by the reset control signal RG. When the reset transistor RX is turned on, the power supply voltage VDD may be applied to the second floating diffusion node FD2. If the gain control transistor DRX is turned on while the reset transistor RX is turned on, the power supply voltage may be applied to the first floating diffusion node FD1 and the second floating diffusion node FD2.

The first switch transistor SX1 may be connected between the second floating diffusion node FD2 and the third floating diffusion node FD3. The second switch transistor SX2 may be connected between the third floating diffusion node FD3 and the fourth floating diffusion node FD4. The first switch transistor SX1 may be turned on or off in response to a first switch control signal SW1, and the second switch transistor SX2 may be turned on or off in response to the second switch control signal SW2.

The first switch transistor SX1 may be turned off in response to the low level first switch control signal SW1. The turned-off first switch transistor SX1 may prevent photo charges generated in the first photoelectric element SPD from being transmitted to the second floating diffusion node FD2. The second switch transistor SX2 may be turned off in response to the low level second switch control signal SW2. The turned-off second switch transistor SX2 may prevent the charge accumulated in the first capacitor MC from being transmitted to the third floating diffusion node FD3.

The photo charges generated in the first photoelectric element SPD and the second photoelectric element LPD may be transmitted to at least one of the first floating diffusion node FD1, the second floating diffusion node FD2, the third floating diffusion node FD3, and the fourth floating diffusion node and accumulated. Although not shown in FIG. 2, each of the first floating diffusion node FD1, second floating diffusion node FD2, third floating diffusion node FD3, and fourth floating diffusion node FD4 may have a parasitic capacitor (not shown) formed or be connected to an actual capacitor element.

In an image sensor, the pixel PX 200 may detect the intensity of light. If the number of pixels PX 200 is large, more light may be detected, so distant objects may be detected well. In order to increase the number of pixels PX 200, it is important to reduce the number of transistors included in the pixel PX 200 and minimize the size of the pixel PX 200 per unit area (Pixel Shrink). Details related to this will be described later in FIG. 5.

The first capacitor MC may be connected between the fourth floating diffusion node FD4 and the power supply voltage line supplying the power supply voltage VDD. When the second switch transistor SX2 is turned on, the third floating diffusion node FD3 and the fourth floating diffusion node FD4 may be connected to each other. In some embodiments, the photo charges generated from the first photoelectric element SPD may overflow during the integration period, and the overflowed charges may be accumulated in the first capacitor MC via the third floating diffusion node FD3 and the fourth floating diffusion node FD4.

The first capacitor MC may include a lateral overflow integration capacitor (LOFIC). If the first capacitor MC includes a LOFIC, overflowed charges among the charges transmitted from the first photoelectric element SPD and/or the second photoelectric element LPD to the third floating diffusion node FD3 may be stored. For example, a large amount of charge that overflows may be integrated into the first capacitor MC without being discarded.

In order to store a large amount of overflowed charges, the capacitance of the first capacitor MC may be greater than the capacitance of the first to fourth floating diffusion nodes FD1, FD2, FD3, and FD4. The first capacitor MC may be filled with a dielectric between electrodes, and the outside of the first capacitor MC may be covered with a metal cap METAL CAP.

Figure 3:
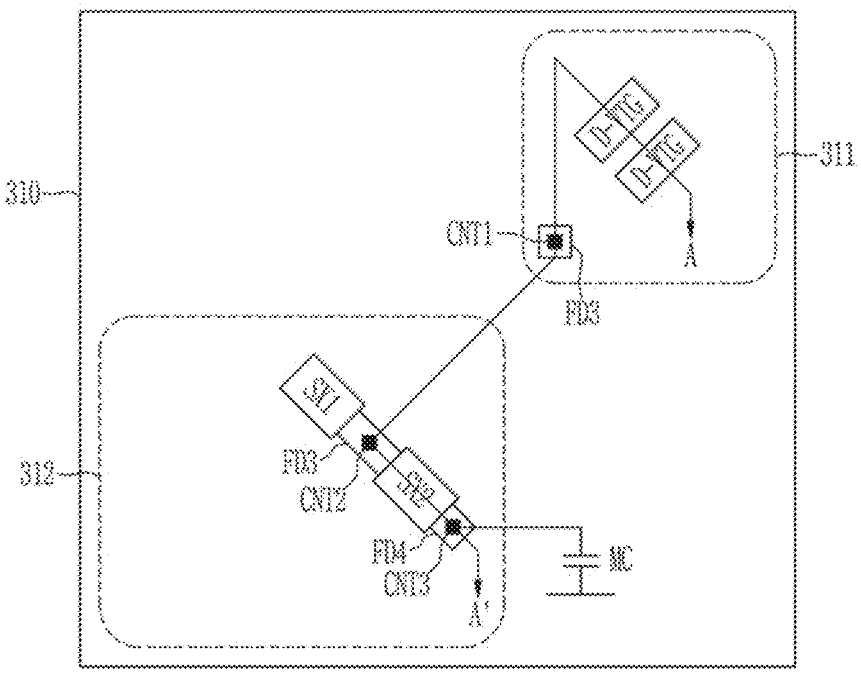
FIG. 3 is a top plan view of a pixel PX according to an example.

FIG. 3 is a top plan view of a pixel PX according to an example.

Referring to FIG. 3, a pixel PX 310 may include a first pixel region 311 and a second pixel region 312. The first pixel region 311 may include the first photoelectric element SPD, and the second pixel region 312 may include the second photoelectric element LPD. The photo charges generated in the first photoelectric element SPD may be accumulated in the third floating diffusion region FD3. The photo charges accumulated in the third floating diffusion region FD3 may be transmitted between the first switch transistor SX1 and the second switch transistor SX2 through a contact CNT1 included in the first pixel region 311 and a contact CNT2 included in the second pixel region 312.

The photo charges transmitted between the first switch transistor SX1 and the second switch transistor SX2 through the contact CNT2 may overflow into the fourth floating diffusion region FD4. Overflowed photo charges may be accumulated in the fourth floating diffusion region FD4. The photo charges accumulated in the fourth floating diffusion region FD4 may be transmitted to the first capacitor MC through a contact CNT3 included in the second pixel region 312.

A plurality of contacts CNT1, CNT2, and CNT3 may each be connected through interconnection. This will be described later. For better understanding and ease of description, among the plurality of transistors LTX, DRX, SF, SEL, RX, SX1, and SX2 included in the second pixel region 312 in FIG. 3, only the first switch transistor SX1 and the second switch transistor SX2 is shown.

Figure 4:
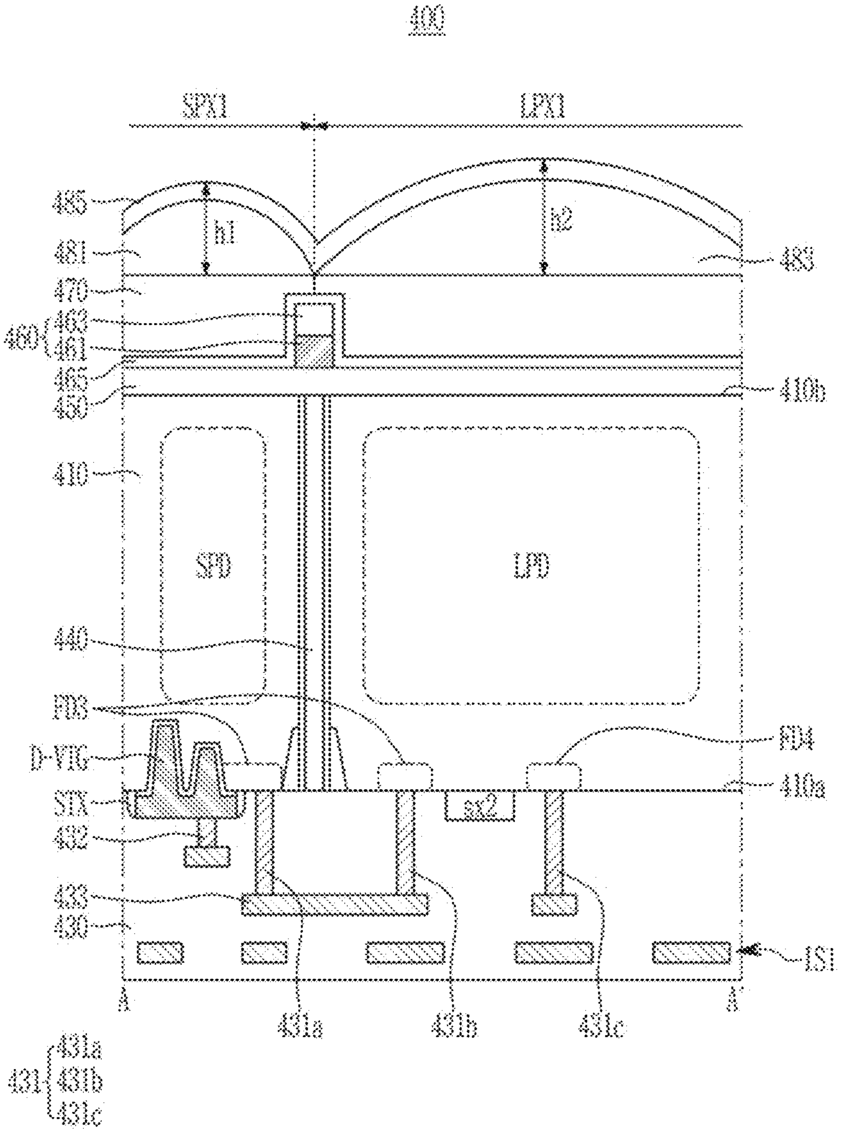
FIG. 4 is a cross-sectional view taken along line AA' of the pixel PX of FIG. 3.

FIG. 4 is a cross-sectional view taken along line AA' of the pixel PX of FIG. 3.

A pixel PX 400 may include a first substrate 410, the first photoelectric element SPD, the second photoelectric element (LPD), a pixel isolation pattern 440, a surface insulating layer 450, a grid pattern 460, a first passivation layer 465, a color filter 470, micro lenses 481 and 483, and a second passivation layer 485.

The first substrate 410 may include a first surface **410*a* and a second surface 410*b* that are opposite to each other. In some embodiments, the first surface 410*a* may be referred to as the front side of the first substrate 410, and the second surface 410*b* may be referred to as the back side of the first substrate 410. In some embodiments, the second surface 410*b* of the first substrate 410** may be a light-receiving surface on which light is incident. For example, the image sensor according to some embodiments may be a backside illuminated (BSI) image sensor.

The first substrate 410 may be a semiconductor substrate. For example, the first substrate 410 may be bulk silicon or silicon-on-insulator (SOI). Alternatively, the first substrate 410 may have an epitaxial layer formed on a base substrate.

In some embodiments, the first substrate 410 may have a first conductivity type. For example, the first substrate 410 may include p-type impurity (e.g., boron (B)). In some embodiments, the description is made assuming that the first conductivity type is p-type, but the present disclosure is not limited thereto, and the first conductivity type may be n-type.

A first pixel SPX1 and a second pixel LPX1 may be disposed on the first substrate 410. The first photoelectric element SPD may be disposed in the first substrate 410 of the first pixel SPX1. The second photoelectric element LPD may be disposed in the first substrate 410 of the second pixel LPX1. The second photoelectric element LPD and the first photoelectric element SPD may have a second conductivity type different from the first conductivity type. In some embodiments, the description is made assuming that the second conductivity type is n-type, but the present disclosure is not limited thereto, and the second conductivity type may be p-type. The second photoelectric element LPD and the first photoelectric element SPD may be formed, for example, by ion implantation of n-type impurities (e.g., phosphorus (P) or arsenic (As)) in the p-type first substrate 410.

In some embodiments, the second photoelectric element LPD and the first photoelectric element SPD may have a potential gradient in a direction that intersects the first surface 410*a* and the second surface 410*b* of the first substrate 410 (e.g., vertical direction). For example, the impurity concentration of the second photoelectric element LPD and the first photoelectric element SPD may decrease from the first surface 410*a* toward the second surface 410*b*.

In some embodiments, the area of the second pixel LPX1 may be larger than the area of the first pixel SPX1 from a two-dimensional perspective. From a two-dimensional perspective, the area of the second photoelectric element LPD may be larger than the area of the first photoelectric element SPD.

The first floating diffusion region FD1 (not shown) may be disposed in the first substrate 410 of the second pixel LPX1. The third floating diffusion region FD3 may be disposed within the first substrate 410 of the first pixel SPX1.

The first floating diffusion region FD1 (not shown) and the third floating diffusion region FD3 may have a second conductivity type. For example, the first floating diffusion region FD1 (not shown) and the third floating diffusion region FD3 may be formed by ion implanting n-type impurities into the p-type first substrate 410.

In some embodiments, each of the first floating diffusion region FD1 (not shown) and the third floating diffusion region FD3 may have a second conductivity type with a higher impurity concentration for the second photoelectric element LPD and the first photoelectric element SPD. For example, the first floating diffusion region FD1 (not shown) and the third floating diffusion region FD3 may be formed by ion implanting a high concentration of n-type impurity into the p-type first substrate 410.

The first transfer gate STX may be disposed on the first surface 410*a* of the first substrate 410. The first transfer gate STX may include a first transmission gate D-VTG, a first gate insulating layer, and a first gate spacer. The first gate insulating layer may be disposed between the first transmission gate D-VTG and the first substrate 410, and the first gate spacer may be disposed on both walls of the first transmission gate D-VTG. In some embodiments, the width of the first transmission gate D-VTG may decrease as it moves away from the first surface 410*a* of the first substrate 410.

A first interconnection structure IS1 may be disposed on the first substrate 410. For example, the first interconnection structure IS1 may be disposed on the first surface 410*a* of the first substrate 410. Additionally, the first interconnection structure IS1 may cover, for example, the first surface 410*a* of the first substrate 410. The first interconnection structure IS1 may contact the first surface 410*a* of the first substrate 410.

The first interconnection structure IS1 may be composed of one or more interconnections. For example, the first interconnection structure IS1 may include a first interconnection insulating layer 430, a plurality of first interconnections 433 in the first interconnection insulating layer 430, a plurality of first contacts 431*a*, 431*b*, and 431*c*, and a plurality of second contacts 432. The number and arrangement of layers of the interconnections 433 and the contacts 431 and 432 configuring the first interconnection structure IS1 are merely illustrative, and the technical idea of the present disclosure is not limited thereto.

Each of the plurality of first contacts 431 may be connected to the floating diffusion regions FD3 to FD4, and the second contact 432 may be connected to the first transfer gate STX. For better understanding and ease of description, only the third and fourth floating diffusion regions FD3 and FD4, the first transfer gate STX, the first switch transistor SX1, and the second switch transistor SX2 are shown in FIG. 4.

The plurality of first contacts 431 and the plurality of second contacts 432 may be connected by a first interconnection 433. The first pixel (LPX1) and the second pixel (SPX1) may be electrically connected through the first interconnection 433. For example, the third floating diffusion region FD3 may be connected to the first contact 431*a*, the area between the first switch transistor SX1 and the second switch transistor SX2 may be connected to the first contact 431*b*, and the first interconnection 433 may be connected between the first contact 431*a* and the first contact 431*b*. The photo charges accumulated in the third floating diffusion region FD3 may be transmitted between the first switch transistor SX1 and the second switch transistor SX2 through the first contact 431*a*, the first interconnection 433, and the first contact 431*b*. The photo charges accumulated in the fourth floating diffusion region FD4 may be transmitted to the first capacitor MC through a first contact 431*c* and the first interconnection 433.

The first interconnection insulating layer 430 may be formed of or include at least one of silicon oxide, silicon nitride, silicon oxynitride, and a low-k material with a lower dielectric constant than silicon oxide. The first interconnection 433, first contact 431, and second contact 432 may include a conductive material.

The pixel isolation pattern 440 may be disposed to surround the first pixel SPX1 and the second pixel LPX1 from a two-dimensional perspective. The pixel isolation pattern 440 may separate the first pixel SPX1 and the second pixel LPX1. The pixel isolation pattern 440 may be disposed within the first substrate 410. For example, an upper surface of the pixel isolation pattern 440 may be coplanar with the second surface 410*b* of the first substrate 410, and a lower surface of the pixel isolation pattern 440 may be coplanar with the first surface 410*a* of the first substrate 410.

The surface insulating layer 450 may be disposed on the second surface 410*b* of the first substrate 410. The surface insulating layer 450 may cover the second surface 410*b* of the first substrate 410. The surface insulating layer 450 may contact the second surface 410*b* of the first substrate 410. The surface insulating layer 450 may include an insulating material.

The surface insulating layer 450 functions as an anti-reflection layer to prevent reflection of light incident on the first substrate 410, thereby improving the light-receiving coefficient of the first photoelectric element SPD and the second photoelectric element LPD. Additionally, the surface insulating layer 450 functions as a planarization film, allowing the color filter 470 and the micro lenses 481 and 483 to be formed at a uniform height.

The color filter 470 may be disposed on the surface insulating layer 450. The color filter 470 may be arranged to correspond to each of the first pixel SPX1 and the second pixel LPX1.

In some embodiments, the grid pattern 460 may be disposed between the color filters 470. The grid pattern 460 may be disposed on the surface insulating layer 450. The grid pattern 460 may contact the surface insulating layer 450. The grid pattern 460 may be formed in a grid shape from a two-dimensional perspective and may be interposed between the color filters 470.

In some embodiments, the grid pattern 460 may include a conductive pattern 461 and a low refractive index pattern 463. The conductive pattern 461 and the low refractive index pattern 463 may be sequentially stacked on the surface insulating layer 450, for example. The conductive pattern 461 may include a conductive material. The low refractive index pattern 463 may include a low refractive index material that has a lower refractive index than silicon (Si). The low refractive index pattern 463 may improve light concentrating efficiency and enhance the quality of the image sensor by refracting or reflecting incident light obliquely.

In some embodiments, the first passivation layer 465 may be disposed on the surface insulating layer 450 and the grid pattern 460. The first passivation layer 465 may be formed of or include, for example, aluminum oxide, but is not limited thereto. The first passivation layer 465 may prevent damage to the surface insulating layer 450 and the grid pattern 460.

The micro lenses 481 and 483 may be disposed on the color filter 470. Each of the micro lenses 481 and 483 has a convex shape and may have a predetermined curvature radius. Accordingly, the micro lenses 481 and 483 may concentrate light incident on the first photoelectric element SPD and the second photoelectric element LPD, respectively. The micro lenses 481 and 483 may include, for example, a light-transmitting resin, but is not limited thereto.

In some embodiments, the second passivation layer 485 may be disposed on the micro lenses 481 and 483. The second passivation layer 485 may extend along the surface of the micro lenses 481 and 483. The second passivation layer 485 may include, for example, an inorganic material oxide layer. For example, the second passivation layer 485 may include at least one of silicon oxide, titanium oxide, zirconium oxide, hafnium oxide, and combinations thereof, but is not limited thereto. In some embodiments, the second passivation layer 485 may include low temperature oxide (LTO).

The second passivation layer 485 may protect the micro lenses 481 and 483 from the outside. For example, the second passivation layer 485 may protect the micro lenses 481 and 483 containing an organic material by including an inorganic material oxide layer. Additionally, the second passivation layer 485 may improve the quality of the image sensor by improving the light concentrating efficiency of the micro lenses 481 and 483. For example, the second passivation layer 485 may fill the space between the micro lenses 481 and 483, thereby reducing reflection, refraction, scattering, etc. of incident light reaching the space between the micro lenses 481 and 483.

Meanwhile, as shown in FIG. 4, the micro lens 481 of the first pixel SPX1 may have a first height h1, and the micro lens 483 of the second pixel LPX may have a second height h2. The first height h1 of the micro lens 481 of the first pixel SPX1 may be a maximum height of the micro lens 481 from an upper surface of the color filter 470 to an upper surface of the second passivation layer 485, and the height h2 of the micro lens 483 of the second pixel LPX may be a maximum height of the micro lens 483 from the upper surface of the color filter 470 to an upper surface of the second passivation layer 485. Meanwhile, as described above, the area of the second photoelectric element LPD may be larger than the area of the first photoelectric element SPD, so the area of the second pixel LPX1 may be larger than the area of the first pixel SPX1. In order to cover the second pixel LPX1 having a larger area, the second height h2 of the micro lens 483 may be higher than the first height h1 of the micro lens 481.

During the integration period in which the first photoelectric element SPD and the second photoelectric element LPD are exposed to light to generate photo charges, leakage of charge may occur in the first floating diffusion region FD1 (not shown). If charge leakage occurs in the first floating diffusion region FD1 (not shown), errors may occur in a plurality of pixel signals generated by photo charges. In order to reduce errors occurring in the pixel signal, when a reset voltage is applied to the first floating diffusion node FD1 (not shown), the charge leaked to the first floating diffusion node FD1 (not shown) may be removed.

The CDS circuit (e.g., CDS circuit 151 in FIG. 1) may first measure the reset voltage of the pixel signal, then measure the sensing voltage, and may extract effective signal components based on the difference between the reset voltage and the sensing voltage. Likewise, effective signal components may be extracted from the second floating diffusion node FD2 (not shown) by first measuring the reset voltage and then measuring the sensing voltage.

However, when extracting effective signal components from a plurality of pixel signals by the first capacitor MC, the CDS circuit 151 may not be used. In the case of the first capacitor MC, the first capacitor MC may have a much larger charge than the third to fourth floating diffusion nodes FD3 and FD4. Even if a reset voltage is applied to the third to fourth floating diffusion nodes FD3 and FD4 and the charges leaked to the third to fourth floating diffusion nodes FD3 and FD4 are removed, the photo charge accumulated in the first capacitor MC may not be transmitted to both the third floating diffusion node FD3 and the fourth floating diffusion node FD4. For example, there is a limitation in first measuring the reset voltage and then measuring the sensing voltage for the pixel signal by the first capacitor MC.

In order to extract effective signal components from the plurality of pixel signals by the first capacitor MC, the readout circuit (e.g., readout circuit 150 in FIG. 1) may first measure the sensing voltage for the plurality of pixel signals, and then measure the reset voltage, thereby extracting effective signal components based on the difference between the sensing voltage and the reset voltage. Accordingly, the leakage current generated in the third to fourth floating diffusion regions FD3 and FD4 may not be removed during the integration period in which the first photoelectric element SPD and the second photoelectric element LPD generate photo charges.

The photo charges accumulated in the third floating diffusion region FD3 may leak through the first contact 431*a* connected to the third floating diffusion region FD3. The photo charges accumulated between the first switch transistor SX1 and the second switch transistor SX2 may leak through the first contact 431*b*. The photo charges accumulated in the fourth floating diffusion region FD4 may leak through the first contact 431*c*.

During the integration period, leakage current may continuously occur from the third floating diffusion region FD3 of the first pixel SPX1, the region between the first switch transistor SX1 and the second switch transistor SX2 of the second pixel LPX1, and the fourth floating diffusion region FD4 of the second pixel LPX1. If leakage current continues to occur in the image sensor, dark signal non-uniformity (DSNU) may increase. Therefore, each pixel PX may not have the same output value even in the same dark state.

Figure 5:
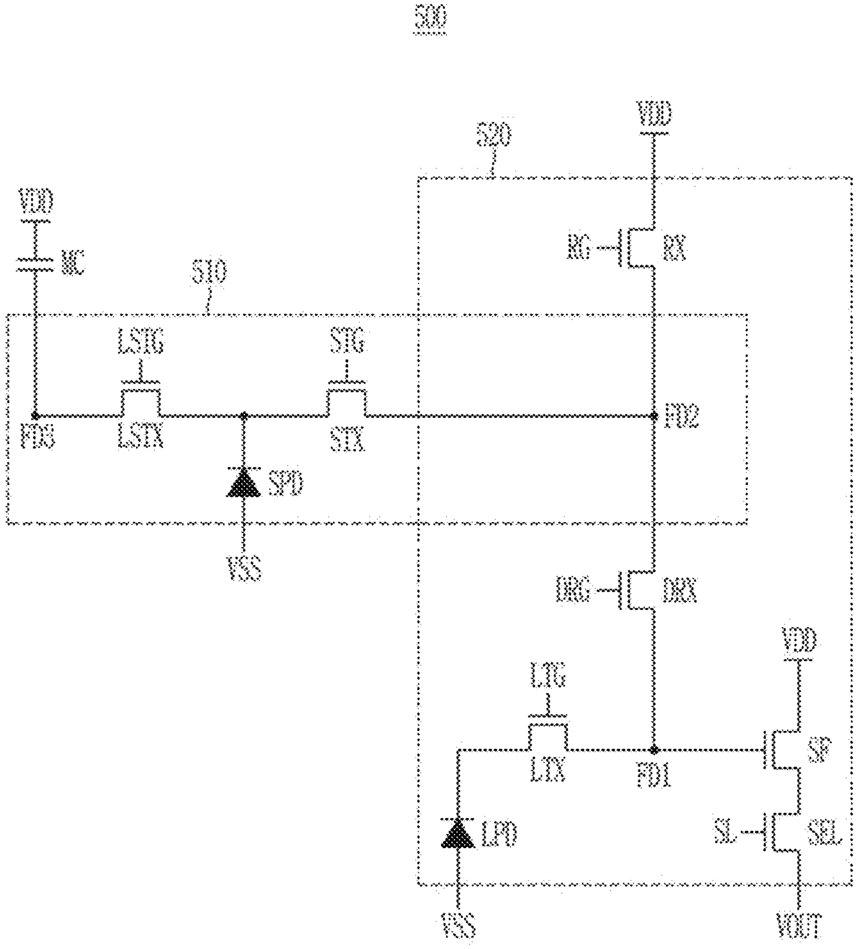
FIG. 5 is a circuit diagram of a pixel PX according to an example embodiment.

FIG. 5 is a circuit diagram of a pixel PX according to an example embodiment.

Referring to FIG. 5, a pixel PX 500 may include a first circuit 510 and a second circuit 520. The first circuit 510 has low international standard organization (ISO) sensitivity and may be used in a high-illuminance environment. Compared to the first circuit 510, the second circuit 520 has higher ISO sensitivity and may be used in a low-illuminance environment. In a high-illuminance environment, a pixel signal is generated through the first circuit 510, and in a low-illuminance environment, a pixel signal is generated through the second circuit 520, so the pixel signal may have a higher dynamic range.

The first circuit 510 may include the first photoelectric element SPD, the first transfer gate STX, and a third transfer gate LSTX. The first transfer gate STX may be connected between the first photoelectric element SPD and the second floating diffusion node FD2. The third transfer gate LSTX may be connected between the first photoelectric element SPD and the third floating diffusion node FD3.

The first transfer gate STX may be controlled by the first control signal STG, and the third transfer gate LSTX may be controlled by a third control signal LSTG. In some embodiments, the control signals STG and LSTG may be generated in the row driver (e.g., row driver 140 in FIG. 1) based on the control of the timing controller (e.g., timing controller 130 in FIG. 1).

The first transfer gate STX, which receives the first control signal STG, may control the movement of photo charges from the first photoelectric element SPD to the second floating diffusion node FD2 like a switch. When the first transfer gate STX is turned on, the charge generated in the first photoelectric element SPD may be transmitted to the second floating diffusion node FD2.

The third transfer gate LSTX, which receives the third control signal LSTG, may control the movement of photo charges from the first photoelectric element SPD to the third floating diffusion node FD3 like a switch. When the third transfer gate LSTX is turned on, the charge generated in the first photoelectric element SPD may be transmitted to the third floating diffusion node FD3.

The first transfer gate STX and the third transfer gate LSTX may each include a VTG. At this time, the number of VTGs of the first transfer gate STX and the third transfer gate LSTX may be different. For example, the first transfer gate STX may be composed of a D-VTG that integrates two VTGs, and the third transfer gate LSTX may be composed of one single vertical transfer gate S-VTG.

In some embodiments, the number of VTGs of the first transfer gate STX and the third transfer gate LSTX may be determined so that the photo charges generated in the first photoelectric element SPD are transmitted only to the third floating diffusion node FD3. The photo charges generated from the first photoelectric element SPD may be transmitted to the third floating diffusion node FD3 through the third transfer gate LSTX.

The photo charge transmitted to the third floating diffusion node FD3 may be transmitted to the first capacitor MC connected to the third floating diffusion node FD3. The other end of the first capacitor MC may receive the driving voltage VDD from the driving voltage source. In some embodiments, the first capacitor MC may include a horizontal overflow accumulation capacitor (LOFIC).

Charges generated by the first photoelectric element SPD and the second photoelectric element LPD may be accumulated in the first capacitor MC through the first floating diffusion node FD1, the second floating diffusion node FD2, and the third floating diffusion node FD3.

The second circuit 520 is substantially the same as the second circuit 220 of FIG. 2, but the second circuit 520 may not include the first switch transistor SX1 and the second switch transistor SX2.

The second circuit 520 may include the first transfer gate STX. The potential voltage of the first transfer gate STX may be increased by the off-level voltage applied to the first transfer gate STX. As the potential voltage of the first transfer gate STX increases, the photo charges leaked from the second photoelectric element LPD may not be transmitted to the first capacitor MC, and the photo charges accumulated in the first capacitor MC may not be transmitted to the second circuit 520.

The second circuit 520 may include a third transfer gate (LSTX). The potential voltage of the third transfer gate LSTX may be increased by the off-level voltage applied to the third transfer gate LSTX. As the potential voltage of the third transfer gate LSTX increases, the photo charges leaked from the first photoelectric element SPD may not be transmitted to the first capacitor MC, and the photo charges accumulated in the first capacitor MC may not be transmitted to the second circuit 520.

The number of transistors included in the second circuit 520 is two less than the number of transistors included in the second circuit 220, and the number of transfer gates included in the first circuit 510 is one more than the number of transistors included in the first circuit 210. However, the third transfer gate LSTX is composed of VTG and is smaller in size compared to the transistor. The size of the pixel PX 500 including the first circuit 510 and the second circuit 520 may be significantly smaller than the size of the pixel PX 200 including the first circuit 210 and the second circuit 220. By reducing the pixel PX size per unit area, the resolution of the image sensor using the second circuit 520 may be higher.

The pixel PX 200 of FIG. 2 may include the floating diffusion region FD3 corresponding to the third floating diffusion node FD3 included in the first circuit 210, and the third to fourth floating diffusion regions FD3 and FD4 corresponding to the third to fourth floating diffusion nodes FD3 and FD4 included in the second circuit 220, as described in FIG. 4. The third to fourth floating diffusion regions FD3 and FD4 may include first contacts 431*a*, 431*b*, and 431*c*. Photo charges accumulated in the third to fourth floating diffusion regions FD3 and FD4 may leak through the contacts 431*a*, 431*b*, and 431*c*.

A reset voltage is applied to the first floating diffusion node FD1 and the second floating diffusion node FD2, and the photo charge accumulated in the first floating diffusion region FD1 and the second floating diffusion region FD2, corresponding to the first floating diffusion node FD1 and the second floating diffusion node FD2, may be removed. Accordingly, photo charges may leak from three contacts 431*a*, 431*b*, and 431*c* included in the floating diffusion region FD3 included in the first circuit 210 and the third and fourth floating diffusion regions FD3 and FD4 included in the second circuit 220.

The pixel PX 500 of FIG. 5 may include the floating diffusion region FD3 corresponding to the third floating diffusion node FD3 included in the first circuit 510. The photo charges accumulated in the floating diffusion region FD3 may leak through the contact. In the pixel PX 500, a reset voltage is applied to the first floating diffusion node FD1 and the second floating diffusion node FD2, and the photo charges accumulated in the floating diffusion regions FD1 and FD2, corresponding to the first floating diffusion node FD1 and the second floating diffusion node FD2, may be removed. Accordingly, photo charges may leak from only one contact included in the floating diffusion region FD3. By reducing the number of contacts through which current leaks during the integration period, the DSNU of the pixel PX 500 of FIG. 4 may be improved compared to the pixel PX 200 of FIG. 2. The pixel PX 500 with improved DSNU may improve image quality by generating a constant current even in a dark environment. This will be described with reference to FIGS. 6 and 7.

Figure 6:
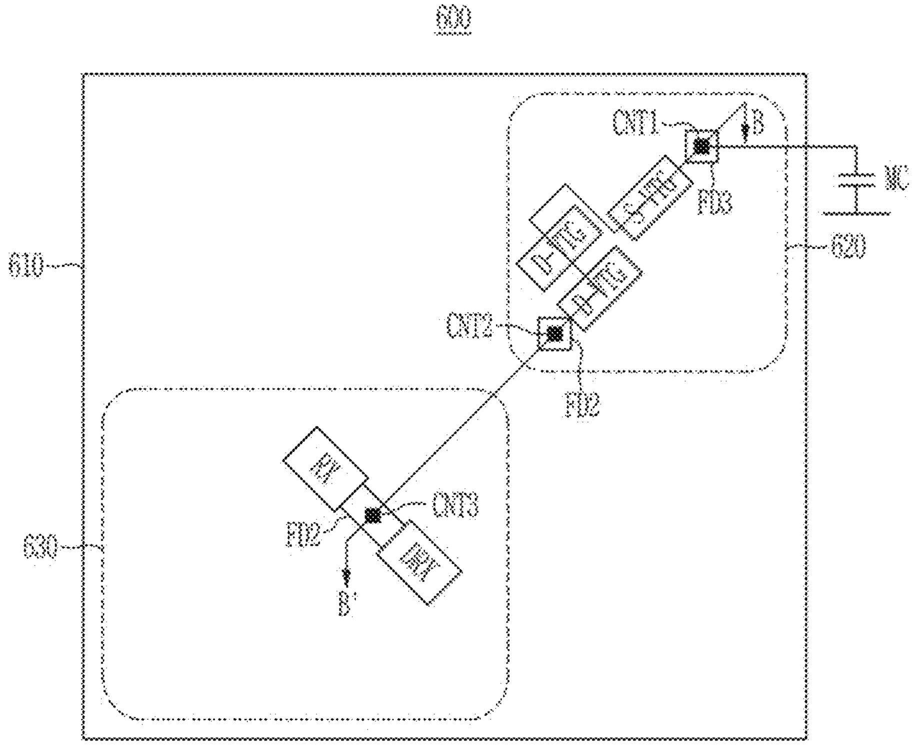
FIG. 6 is a top plan view of a pixel PX according to an example embodiment.

FIG. 6 is a top plan view of a pixel PX according to an example embodiment.

Referring to FIG. 6, a pixel PX 610 may include a first pixel region 620 and a second pixel region 630. The first pixel region 620 may include the first photoelectric element SPD, and the second pixel region 630 may include the second photoelectric element LPD. The photo charges generated in the first photoelectric element SPD may be accumulated in the second floating diffusion node FD2. The photo charges accumulated in the second floating diffusion region FD2 may be transmitted between the reset RX and the gain transistor DRX through the contact CNT2 included in the first pixel region 620 and the contact CNT3 included in the second pixel region 630. In some embodiments, photo charges generated in the first photoelectric element SPD may overflow into the third floating diffusion region FD3. Overflowed photo charges may be accumulated in the third floating diffusion region FD3. The photo charges accumulated in the third floating diffusion region FD3 may be transmitted to the first capacitor MC through the contact CNT1 included in the first pixel region 620.

The first pixel region 620 may include the first transfer gate STX made of D-VTG and the third transfer gate LSTX made of S-VTG. The second pixel region 630 may include a plurality of transistors LTX, DRX, SF, SEL, and RX excluding the first transfer gate STX and the third transfer gate LSTX. For better understanding and ease of description, the plurality of transistors LTX, DRX, SF, SEL, and RX included in the second pixel region 630 are omitted.

Figure 7:
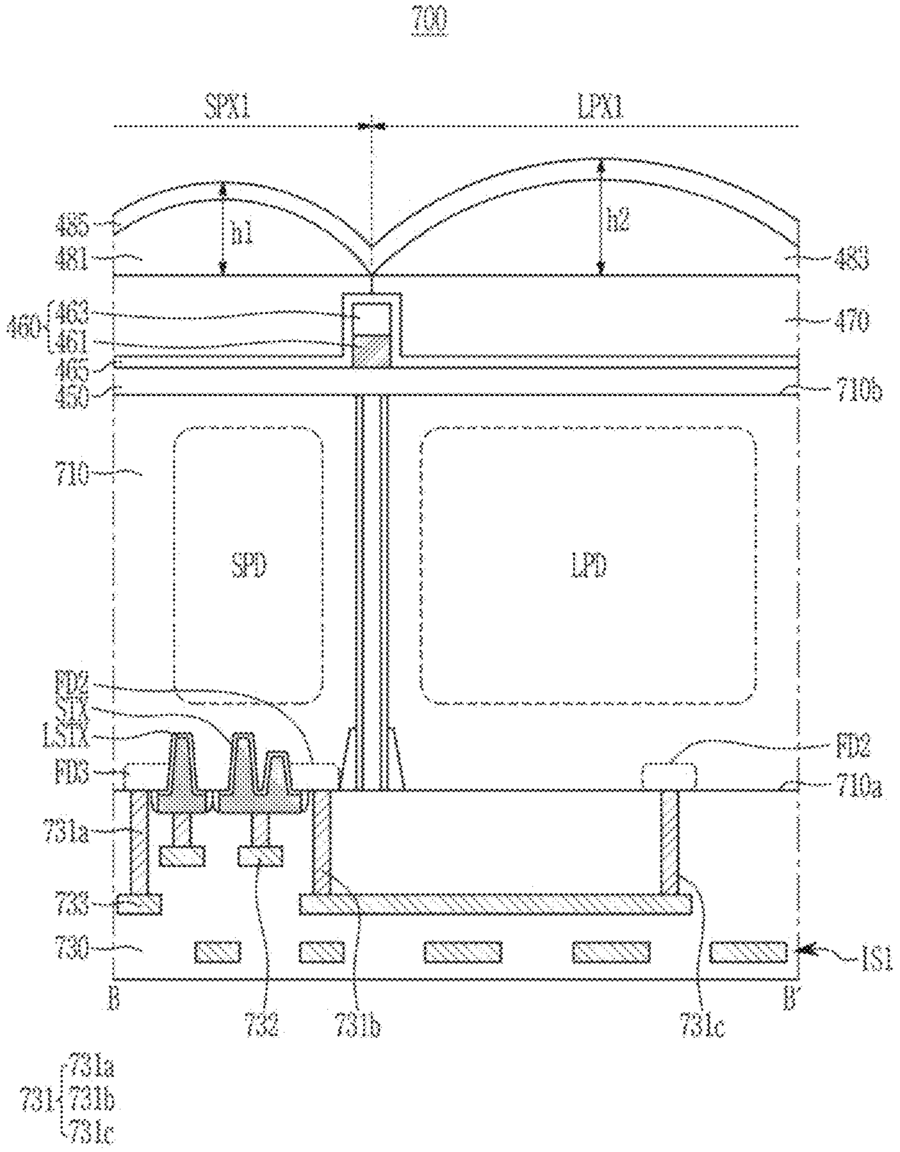
FIG. 7 is a cross-sectional view taken along line BB' of the pixel PX of FIG. 6.

FIG. 7 is a cross-sectional view taken along line BB' of the pixel PX of FIG. 6.

A pixel PX 700 may include a first substrate 710, the first photoelectric element SPD, and the second photoelectric element LPD. The first substrate 710 may include a first surface 710*a* and a second surface 710*b* that are opposite to each other. The first pixel SPX1 and the second pixel LPX1 may be disposed on the first substrate 710. The first photoelectric element SPD may be disposed in the first substrate 710 of the first pixel SPX1. The second photoelectric element LPD may be disposed in the first substrate 710 of the second pixel LPX1. From a two-dimensional perspective, the area of the second pixel LPX1 may be larger than the area of the first pixel SPX1. From a two-dimensional perspective, the area of the second photoelectric element LPD may be larger than the area of the first photoelectric element SPD.

The pixel PX 700 may include a surface insulating layer 450, a grid pattern 460, a first passivation layer 465, a color filter 470, micro lenses 481 and 483, and a second passivation layer 485. In some embodiments, the grid pattern 460 may include a conductive pattern 461 and a low refractive index pattern 463.

The second floating diffusion region FD2 and the third floating diffusion region FD3 may be disposed within the first substrate 710 of the first pixel SPX1. The first transfer gate STX, the third transfer gate LSTX, the reset transistor RX, the gain control transistor DRX, the driving transistor SF, and the selection transistor SEL may be disposed on the first surface 710*a* of the first substrate 710. For better understanding and ease of description, the second transfer gate LTX, the driving transistor SF, and the selection transistor SEL are omitted in FIG. 7.

The first interconnection structure IS1 may be disposed on the first substrate 710. For example, the first interconnection structure IS1 may be disposed on the first surface 710*a* of the first substrate 710. Additionally, the first interconnection structure IS1 may cover, for example, the first surface 710*a* of the first substrate 710.

The first interconnection structure IS1 may be composed of one or more interconnections. For example, the first interconnection structure IS1 may include a first interconnection insulating layer 730, a plurality of first interconnections 733 in the first interconnection insulating layer 730, a plurality of first contacts 731, and a plurality of second contacts 732. The number and arrangement of layers of the interconnections 733 and the contacts 731 and 732 configuring the first interconnection structure IS1 are merely illustrative, and the technical idea of the present disclosure is not limited thereto.

The plurality of first contacts 731 may be respectively connected to the second to third floating diffusion regions FD2 to FD3, and the plurality of second contacts 732 may be respectively connected to the transfer gates STX and LSTX. The plurality of first contacts 731 and the plurality of second contacts 732 may be connected with the first interconnection 733. The first interconnection 733 may be electrically connected to the first pixel LPX1 and the second pixel SPX1.

For example, the first interconnection 733 may be connected to the first substrate 710 through the first contacts 731*b* and 731*c*. The photo charges accumulated in the second floating diffusion region FD2 may be transmitted between the reset transistor RX and the gain control transistor DRX through the first contacts 731*b* and 731*c* and the first interconnection 733. The photo charges accumulated in the third floating diffusion region FD3 may overflow into the first capacitor MC through the first contact 731*a* and the first interconnection 733.

The first capacitor MC may have a much larger charge than the third floating diffusion region FD3. Even if a reset voltage is applied to the third floating diffusion node FD3 and the charges leaked to the third floating diffusion node FD3 are removed, the photo charge accumulated in the first capacitor MC may not all be transmitted to the third floating diffusion node FD3. Accordingly, the leakage current generated in the third floating diffusion region FD3 may not be removed during the integration period in which the first photoelectric element SPD and the second photoelectric element LPD generate photo charges.

The photo charges accumulated in the third floating diffusion region FD3 may leak through the first contact 731*a* and the first interconnection 733 connected to the third floating diffusion region FD3. Leakage current continuously occurs from the third floating diffusion region FD3 of the first pixel SPX1, which may increase the dark signal non-uniformity (DSNU) of the image sensor.

However, compared to the pixel 400 of FIG. 4, the number of contacts through which current leaks in the pixel 700 of FIG. 7 may be reduced. In the pixel 400, current may leak from the three contacts 431*a*, 431*b*, and 431*c* respectively connected to the third floating diffusion region FD3 of the first pixel SPX1, the region between the first switch transistor SX1 and the second switch transistor SX2 of the second pixel LPX1, and the fourth floating diffusion region FD4 of the second pixel LPX1. The pixel 700 may leak current only through the first contact 731*c* connected to the third floating diffusion region FD3 of the first pixel SPX1.

The pixel 700 generates less leakage current than the pixel 400, so the DSNU of the image sensor using the pixel 700 may be lower than the DSNU of the image sensor using the pixel 400. Accordingly, the image sensor using the pixel 700 may have higher output value accuracy than the image sensor using the pixel 400 in the same dark state.

Figure 8:
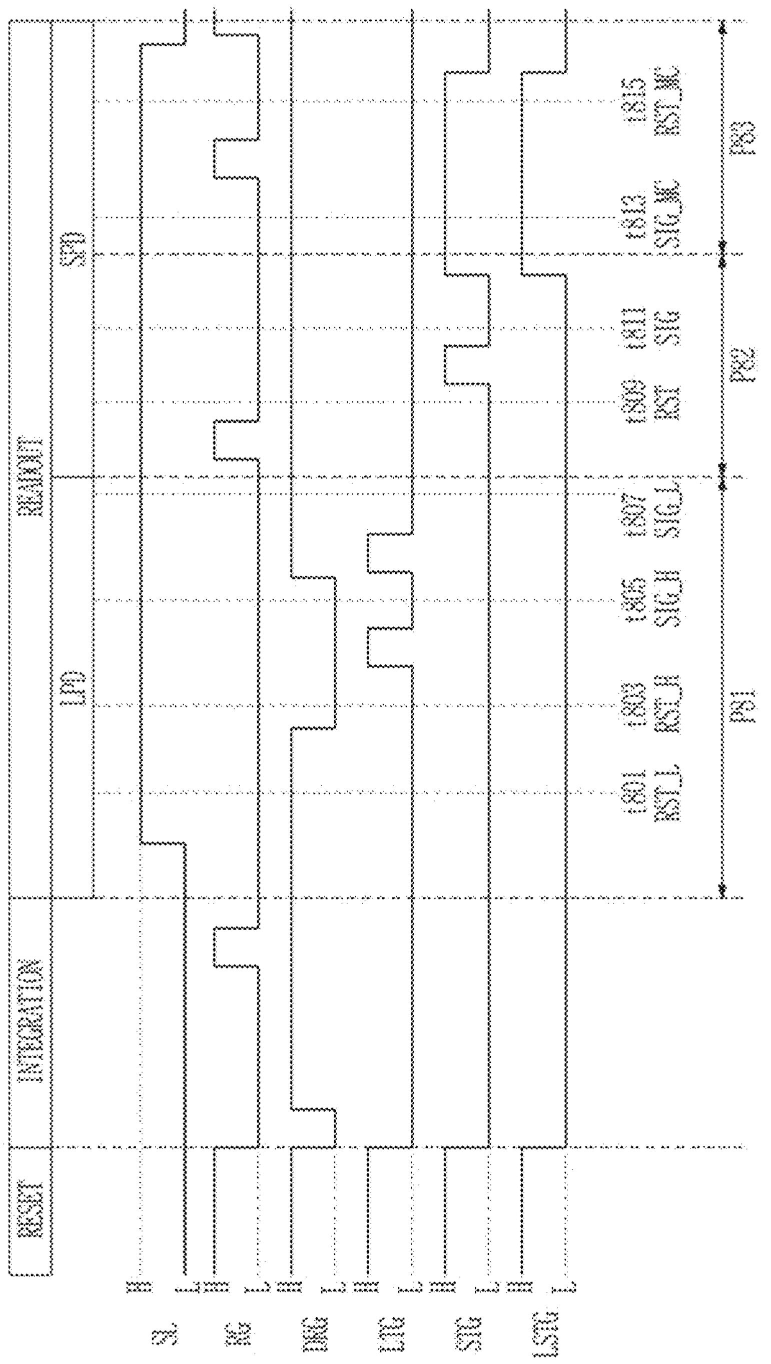
FIG. 8 is a timing diagram illustrating the operation of the pixel PX according to FIG. 5.

FIG. 8 is a timing diagram illustrating the operation of the pixel PX according to FIG. 5.

In FIG. 8, a scan section for driving a plurality of pixels PX on a row line basis may be shown. One scan section may sequentially include a reset section RESET, an integration section INTEGRATION, and a readout section READOUT.

In the reset period RESET, the charges stored in the first floating diffusion node FD1, the second floating diffusion node FD2, and the third floating diffusion node FD3 may be reset.

Specifically, in the reset period RESET, a reset control signal RG, a gain control signal DRG, a first control signal STG, a second control signal LTG, and a third control signal LSTG may all have a high-level H. Accordingly, the first floating diffusion node FD1, the second floating diffusion node FD2, and the third floating diffusion node FD3 may all be reset to the power supply voltage VDD.

The integration section INTEGRATION is a section in which the first photoelectric element SPD and the second photoelectric element LPD are exposed to light to generate charges. In the integration period INTEGRATION, the reset control signal RG, the gain control signal DRG, the first control signal STG, the second control signal LTG, and the third control signal LSTG may be transitioned to a low-level L.

Meanwhile, the gain control signal DRG may become high-level H again after a certain period of time. While the gain control signal DRG maintains the high-level H, the reset control signal RG may transition from the low-level L to the high-level H. The first floating diffusion node FD1 and the second floating diffusion node FD2 may be reset to the power supply voltage according to the high-level H gain control signal DRG and reset control signal RG.

Afterwards, the reset control signal RG may transition from the high-level H to the low-level L. As the reset control signal RG transitions to the low-level L, the selection control signal SL may transition from the low-level L to the high-level H.

The readout section READOUT is a section in which the pixel signal VOUT generated in the pixel PX 500 is transmitted to the readout circuit (e.g., readout circuit 150 in FIG. 1). One readout section READOUT may include a LPD readout section LPD READOUT that reads out the pixel signals corresponding to the second photoelectric element LPD and an SPD readout section SPD READOUT that reads out the pixel signals corresponding to the first photoelectric element SPD.

The LPD readout section LPD READOUT may include a first section P81. The first section P81 may be a section in which a high conversion gain HCG operation and a low conversion gain LCG operation for the second photoelectric element LPD are performed.

First, at t801, according to the gain control signal DRG of the high-level H, the first floating diffusion node FD1 is connected to the second floating diffusion node FD2, so the pixel PX 400 may operate in a low conversion gain LCG mode. Reset signals corresponding to the reset first floating diffusion node FD1 and the second floating diffusion node FD2 may be output through the column lines CL1, CL2, . . . , CLm−1. For example, at t801, a reset signal RST_L in the low conversion gain LCG mode for the second photoelectric element LPD may be output as the pixel signal VOUT.

After t801, according to the gain control signal DRG of the high-level H, the first floating diffusion node FD1 is not connected to the second floating diffusion node FD2, so the pixel PX 400 may operate in the low conversion gain LCG mode. A reset signal corresponding to the reset first floating diffusion node FD1 may be output through the column lines CL1, CL2, . . . , CLm−1. For example, at t803, a reset signal RST_H in the high conversion gain HCG mode for the second photoelectric element LPD may be output as the pixel signal VOUT. After t803, the second control signal LTG may transition from the low-level L to the high-level H. Charges generated by the second photoelectric element LPD may be provided to the first floating diffusion node FD1 according to the second control signal LTG of high-level H. After the charge generated by the second photoelectric element (LPD) is provided to the first floating diffusion node (FD1), the second control signal (LTG) may transition from high level (H) to low level (L).

In t805, an image signal corresponding to the first floating diffusion node FD1 may be output through the column lines CL1, CL2, . . . , CLm−1. At this time, the gain control signal DRG may maintain the low-level L, and since the second floating diffusion node FD2 is not connected to the first floating diffusion node FD1, the pixel PX 200 may operate in high conversion gain HCG mode. For example, at t805, an image signal SIG_H in the high conversion gain HCG mode for the second photoelectric element LPD may be output as the pixel signal VOUT.

After t805, the gain control signal DRG and the second control signal LTG may transition from the low-level L to the high-level H. According to the gain control signal DRG of the high-level H, the first floating diffusion node FD1 is connected to the second floating diffusion node FD2, so the pixel PX 400 may operate in a low conversion gain LCG mode. Charges generated by the second photoelectric element LPD may be provided to the first floating diffusion node FD1 and the second floating diffusion node FD2 according to the second control signal LTG of high-level H.

In t807, image signals corresponding to the first floating diffusion node FD1 and the second floating diffusion node FD2 may be output through the column lines CL1, CL2, . . . , CLm−1. At this time, since the gain control signal DRG maintains the high-level H, the pixel PX 200 may operate in the low conversion gain LCG mode. For example, the image signal SIG_L in the low conversion gain HCG mode for the second photoelectric element LPD may be output as the pixel signal VOUT at t807.

After t807, the reset control signal RG may transition from the low-level L to the high-level H. According to the high-level H reset control signal RG, the first floating diffusion node FD1 and the second floating diffusion node FD2 may be reset to the power supply voltage. Accordingly, charges remaining after output of pixel signals from the second photoelectric element LPD may be removed. Afterwards, the reset control signal RG may transition to the low-level L.

The SPD readout section SPD READOUT may include a second section P82 and a third section P83. The second section P82 may be a section in which a CDS operation is performed on the first photoelectric element SPD. The third section P83 may be a section in which a NON-CDS operation is performed on overflowed charges for the first photoelectric element SPD.

In t809, reset signals corresponding to the reset first floating diffusion node FD1 and the second floating diffusion node FD2 may be output through the column lines CL1, CL2, . . . , CLm−1. For example, the reset signal RST for the first photoelectric element SPD may be output as the pixel signal VOUT at t809.

After t809, the first control signal STG may transition from the low-level L to the high-level H. The photo charges generated by the first photoelectric element SPD according to the first control signal STG of the high-level H may be provided to the first floating diffusion node FD1, the second floating diffusion node FD2, and the third floating diffusion node FD3. After providing photo charges to the first floating diffusion node FD1, the second floating diffusion node FD2, and the third floating diffusion node FD3, the first control signal STG may transition from the high-level H to the low-level L.

At t811, image signals corresponding to the first floating diffusion node FD1, the second floating diffusion node FD2, and the third floating diffusion node FD3 may be output through the column lines CL1, CL2, . . . , CLm−1. For example, the image signal SIG for the first photoelectric element SPD may be output as the pixel signal VOUT at t811.

After t811, the first control signal STG and the third control signal LSTG may transition from the low-level L to the high-level H. The photo charges generated by the first photoelectric element SPD according to the first control signal STG, the third control signal LSTG, and the gain control signal DRG of the high-level H may be provided to the first floating diffusion node FD1, the second floating diffusion node FD2, and the third floating diffusion node FD3.

Meanwhile, charges overflowing from the first photoelectric element SPD due to an exposure operation may be accumulated in the first capacitor MC. At t813, an image signal corresponding to the first capacitor MC may be output through the column lines CL1, CL2, . . . , CLm−1. For example, the pixel signal output from t813 is an image signal SIG_MC for the overflowed charge of the first photoelectric element SPD.

After t813, the reset control signal RG may transition from the low-level L to the high-level H. At this time, the gain control signal DRG is at the high-level H, and the first control signal STG and the third control signal LSTG are also maintained at the high-level H, so the first floating diffusion node FD1, the second floating diffusion node FD2, and the third floating diffusion node FD3 may be reset. Since the third control signal LSTG maintains the high-level H, the charge accumulated in the first capacitor MC may also be reset.

At t815, reset signals corresponding to the reset first floating diffusion node FD1, second floating diffusion node FD2, and third floating diffusion node FD3 may be output through the column lines CL1, CL2, . . . , CLm−1. For example, at t815, a reset signal RST_MC for the overflowed charge of the first photoelectric element SPD may be output as the pixel signal VOUT.

The pixel PX may sequentially output the low conversion gain LCG mode reset signal RST_L for the second photoelectric element LPD, the high conversion gain HCG mode reset signal RST_H, the high conversion gain HCG mode image signal SIG_H, the low conversion gain LCG mode image signal SIG_L, the reset signal RST for the first photoelectric element SPD, the image signal SIG for the first photoelectric element SPD, the image signal SIG_MC for the overflowed charge of the first photoelectric element SPD, and the reset signal RST_MC for the overflowed charge of the first photoelectric element SPD. Meanwhile, the present disclosure is not limited thereto, and the image sensor may read the signal of the pixel PX 400 through an appropriate readout operation.

Meanwhile, in FIG. 8, it is described that a plurality of transistors are enabled when the high-level H signal is applied, but the present disclosure is not limited thereto, and any transistor may be enabled when the low-level L signal is applied.

Figure 9:
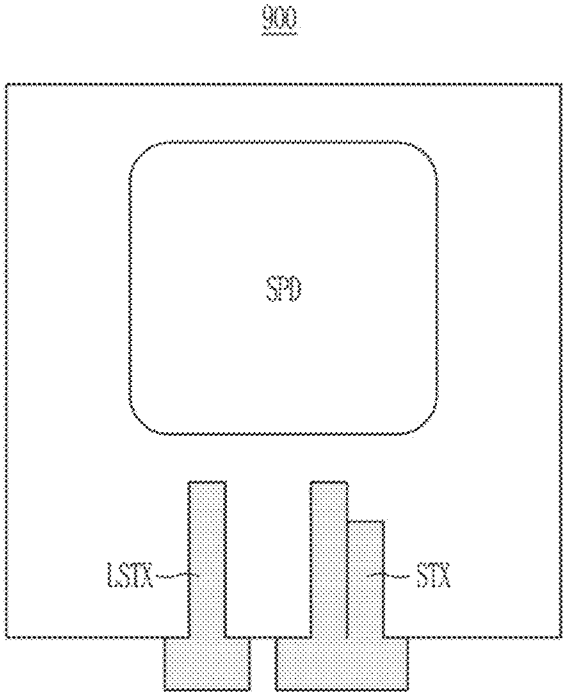
FIG. 9 is an illustration of photo charge overflowing into a floating diffusion node.

FIG. 9 is an illustration of photo charge overflowing into a floating diffusion node.

Referring to FIG. 9, the first transfer gate STX may be composed of a D-VTG in which two VTGs are integrated. The first transfer gate STX may be connected between the first photoelectric element SPD and the second floating diffusion node FD2. Photoelectrons generated in the first photoelectric element SPD may be transmitted to the second floating diffusion node FD2 through the first transfer gate STX.

The third transfer gate LSTX may be composed of an S-VTG in which one VTG is integrated. The third transfer gate LSTX may be connected between the first photoelectric element SPD and the third floating diffusion node FD3. Photoelectrons generated in the first photoelectric element SPD may be transmitted to the third floating diffusion node FD3 through the third transfer gate LSTX.

As the number of VTGs increases, the threshold voltage of the transfer gate may increase. Accordingly, the first transfer gate STX configured with a D-VTG may have a higher threshold voltage than the third transfer gate LSTX configured with an S-VTG. Since the threshold voltage of the third transfer gate LSTX is lower than that of the first transfer gate STX, photoelectrons generated in the first photoelectric element SPD may be easily transmitted to the third floating diffusion node FD3 through the third transfer gate LSTX with a lower threshold voltage.

If the photo charge generated in the first photoelectric element SPD exceeds the capacity of the first photoelectric element SPD, even if the first transfer gate STX and the third transfer gate LSTX are turned off, photo charges may be transmitted to the first transfer gate STX or the third transfer gate LSTX. If the threshold voltage of the third transfer gate LSTX is lower than the threshold voltage of the first transfer gate STX, the photo charges generated in the first photoelectric element SPD may overflow to the third floating diffusion through the third transfer gate LSTX.

Figure 10:
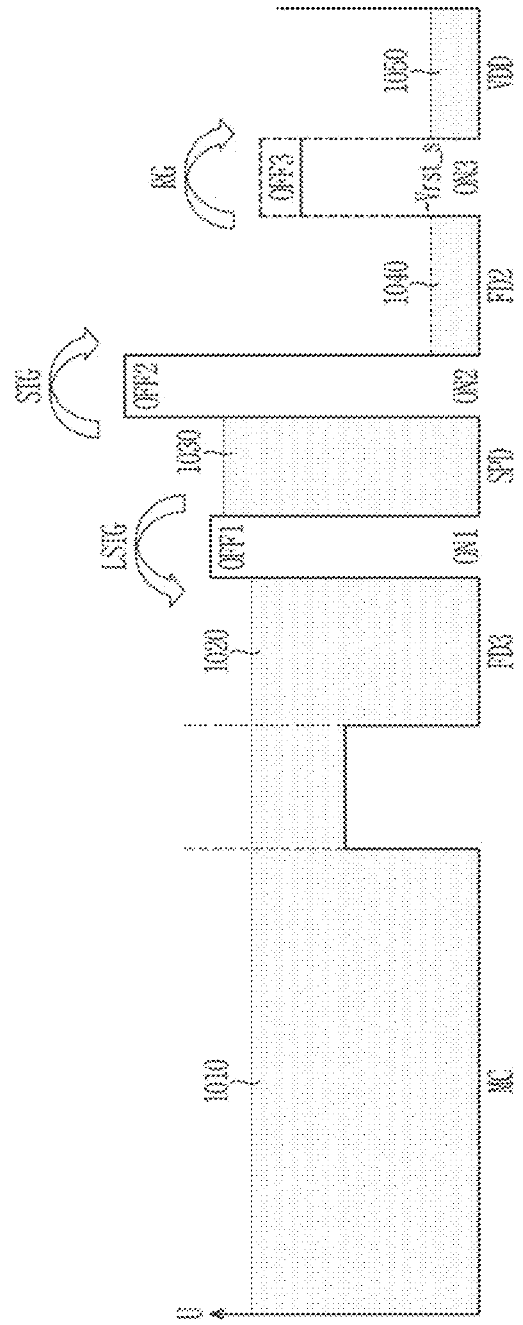
FIG. 10 illustrates the potential level for a floating diffusion node, etc. when the reset signal for a first photoelectric element is output as a pixel signal.

FIG. 10 illustrates the potential level for a floating diffusion node, etc. when the reset signal for a first photoelectric element is output as a pixel signal.

Specifically, FIG. 10 shows potential levels U of the first photoelectric element SPD, the second floating diffusion node FD2, the third floating diffusion node FD3, the first capacitor MC and a reset voltage source VDD when the reset signal RST for the first photoelectric element SPD is output as the pixel signal VOUT at t809 of FIG. 8. At t809, it is assumed and described that the potential level of the first floating diffusion node FD1 is equal to a potential level 1040 of the second floating diffusion node FD2, according to the high-level H personal control signal DRG.

Referring to FIG. 10, the third transfer gate LSTX may be connected between the third floating diffusion node FD3 and the first photoelectric element SPD. The first transfer gate STX may be connected between the first photoelectric element SPD and the second floating diffusion node FD2. The reset transistor RX may be connected between the second floating diffusion node FD2 and the reset voltage source VDD.

A potential level 1020 of the third floating diffusion node FD3 may vary between a first potential ON1 and a second potential OFF1 in response to the logic level of the third control signal LSTG. The potential level 1040 of the second floating diffusion node FD2 may vary between a first potential ON2 and a second potential OFF2 in response to the logic level of the first control signal STG. Since the photo charges generated from the first photoelectric element SPD are not transmitted to the third floating diffusion node FD3 and the first floating diffusion node FD1, a potential level 1030 of the first photoelectric element SPD may be higher than the potential level 1020 of the third floating diffusion node FD3 and the potential level 1040 of the second floating diffusion node FD2. A potential level 1050 of the reset voltage VDD may vary between a first potential ON3 and a second potential OFF3 in response to the logic level of the reset control signal RG.

For example, the potential level 1020 of the third floating diffusion node FD3 may have a potential level value close to the second potential OFF1 based on the third control signal LSTG of the low-level L. The potential level 1040 of the second floating diffusion node FD2 may have a potential level value close to the second potential OFF2 based on the first control signal STG of the low-level L. The potential level 1050 of the reset voltage VDD may have a potential level value close to the first potential ON3 based on the high-level H reset control signal RG.

In FIG. 10, it is shown that the first potential ON1, the first potential ON2, and the first potential ON3 are the same potentials, and the second potential OFF1, the second potential OFF2, and the second potential OFF3 are different potentials, but the present disclosure is not limited thereto. Each of the plurality of first potentials ON1, ON2, and ON3 may have a different value, and the plurality of second potentials OFF1, OFF2, and OFF3 may have the same value.

Photo charges generated in the first photoelectric element SPD may correspond to the entire area of the hatched portions. The first photoelectric element SPD may generate photo charges that exceed the threshold voltage of the third transfer gate LSTX. Photo charges that exceed the threshold voltage of the third transfer gate LSTX may cross the third transfer gate LSTX and move to another storage space through the third floating diffusion node FD3.

Specifically, photo charges sufficient to exceed the threshold voltage of the third transfer gate LSTX may be transmitted to the first capacitor MC through the third floating diffusion node FD3. In the present disclosure, the first capacitor MC may be directly connected to the third floating diffusion node FD3 without using a transistor.

In t809, a large amount of charge overflowing from the first photoelectric element SPD may accumulate in the first capacitor MC. The charge accumulation capacity of the first capacitor MC may be greater than that of the third floating diffusion node FD3. Accordingly, charges overflowing from the third floating diffusion node FD3 may be accumulated in the first capacitor MC rather than being discarded. A potential level 1010 of the first capacitor MC may be the same as the potential level 1020 of the third floating diffusion node FD3.

At t807 to t809, the reset control signal RG may transition from the low-level L to the high-level H, and then again from the high-level H to the low-level L. At this time, it can be seen that the first control signal STG that controls the first transfer gate STX connected to the first photoelectric element SPD and the second control signal LSTG that controls the second transfer gate LSTX connected to the second photoelectric element LPD are at the low-level L. Accordingly, the applied reset voltage VDD may be preserved in the second floating diffusion node FD2 and the first floating diffusion node FD1 at t809. Photo charges corresponding to the reset voltage VDD may be accumulated in the second floating diffusion node FD2 and the first floating diffusion node FD1 to which the reset voltage VDD is applied.

Figure 11:
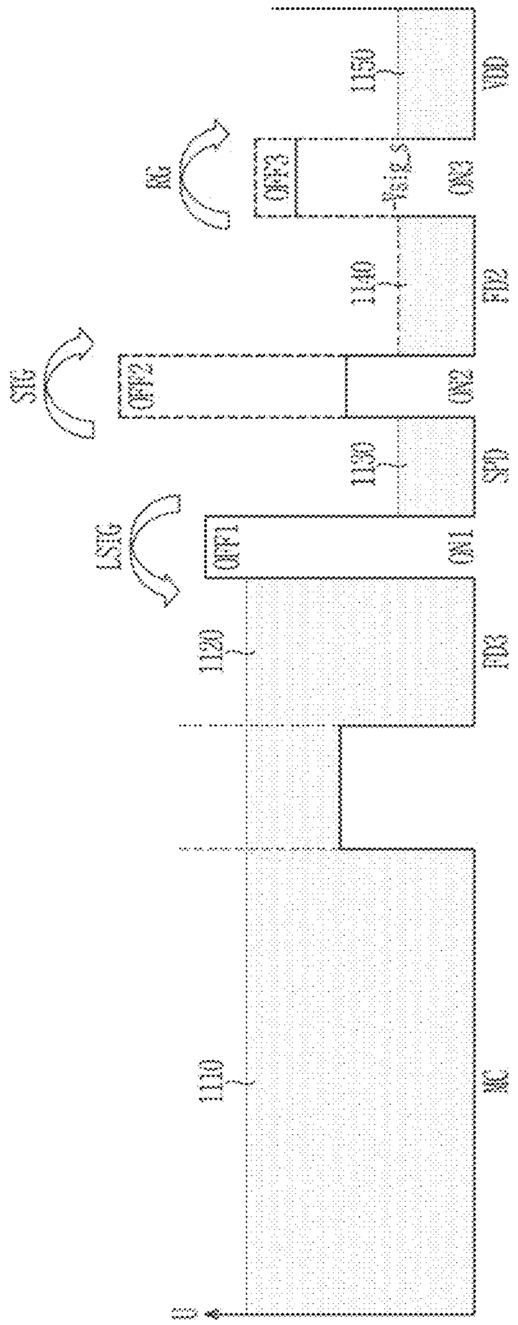
FIG. 11 illustrates the potential level for a floating diffusion node, etc. when the image signal for the first photoelectric element is output as a pixel signal.

FIG. 11 illustrates the potential level for a floating diffusion node, etc. when the image signal for the first photoelectric element is output as a pixel signal.

Specifically, FIG. 11 shows potential levels U of the first photoelectric element SPD, the second floating diffusion node FD2, the third floating diffusion node FD3, the first capacitor MC and a reset voltage source VDD when the image signal SIG for the first photoelectric element SPD is output as the pixel signal VOUT at t811 of FIG. 8. At t811, it is assumed and described that the potential level of the first floating diffusion node FD1 is equal to a potential level 1140 of the second floating diffusion node FD2, according to the high-level H personal control signal DRG.

At t811, a potential level 1120 of the third floating diffusion node FD3 may have a potential level value close to the second potential OFF1 based on the third control signal LSTG of the low-level L. The potential level 1140 of the second floating diffusion node FD2 may have a potential level value close to the first potential ON2 based on the first control signal STG of the high-level L. Since the photo charge generated from the first photoelectric element SPD is transmitted to the first floating diffusion node FD1, a potential level 1130 of the first photoelectric element SPD may be lower than the potential level 1120 of the third floating diffusion node FD3. A potential level 1150 of the reset voltage VDD may have a potential level value close to the second potential OFF3 based on the low-level L reset control signal RG.

At t809 to t811, the first control signal STG may transition from the low-level L to the high-level H, and then again from the high-level H to the low-level L. At this time, it can be seen that the third control signal LSTG that controls the third transfer gate LSTX connected to the first photoelectric element SPD and the second control signal LSTG that controls the second transfer gate LSTX connected to the second photoelectric element LPD are at the low-level L. Accordingly, a potential level 1110 of the first capacitor MC and the potential level 1120 of the third floating diffusion node FD3 may be preserved at t811.

Photo charges generated in the first photoelectric element SPD transmitted to the second floating diffusion node FD2 and the first floating diffusion node FD1 may be preserved.

At t811, the reset control signal RG maintains the low-level L, so that the reset voltage VDD cannot be applied to the second floating diffusion node FD2 and the first floating diffusion node FD1 while the photo charge generated in the first photoelectric element SPD is being transmitted to the second floating diffusion node FD2 and the first floating diffusion node FD1.

Accordingly, photo charges corresponding to the reset voltage VDD of t809 and photo charges generated in the first photoelectric element SPD of t811 may be accumulated in the second floating diffusion node FD2 and the first floating diffusion node FD1.

The CDS circuit (e.g., CDS circuit 151 in FIG. 1) may obtain a reset voltage Vrst_R and a sensing voltage Vsig_S from the photo charges accumulated in the second floating diffusion node FD2 and the first floating diffusion node FD1, and extract the difference as an effective signal component. By subtracting the reset voltage Vrst_R from the sensing voltage Vsig_S, reset noise generated in the second floating diffusion node FD2 and the first floating diffusion node FD1 may be removed at t809.

At t809, the CDS circuit 151 may obtain the reset voltage Vrst_R from the photo charges accumulated in the second floating diffusion node FD2 and the first floating diffusion node FD1. At t811, the CDS circuit 151 may obtain the sensing voltage Vsig_S from the photo charges accumulated in the second floating diffusion node FD2 and the first floating diffusion node FD1. The CDS circuit 151 may extract effective signal components based on the difference between the reset voltage Vrst_R and the sensing voltage Vsig_S.

Figure 12:
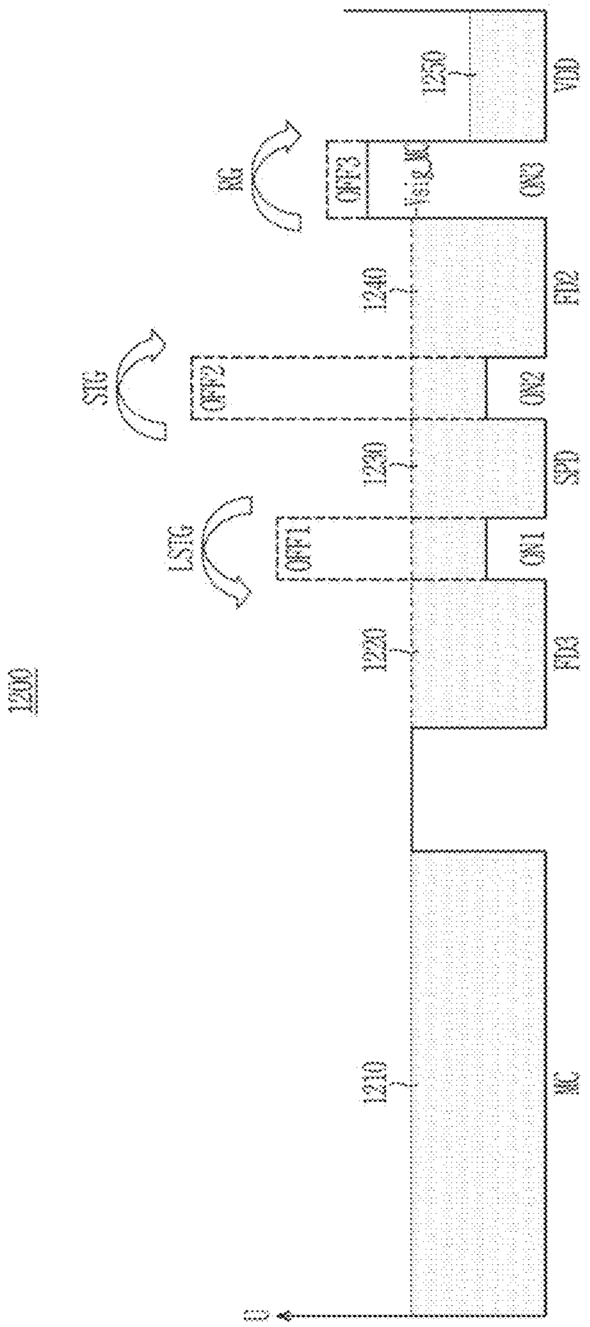
FIG. 12 illustrates the potential level for a floating diffusion node, etc. when the image signal for a first capacitor is output as a pixel signal.

FIG. 12 illustrates the potential level for a floating diffusion node, etc. when the image signal for a first capacitor is output as a pixel signal.

Specifically, FIG. 12 shows potential levels U of the first photoelectric element SPD, the second floating diffusion node FD2, the third floating diffusion node FD3, the first capacitor MC and the reset voltage source VDD when an image signal Vsig_MC for the first capacitor MC is output as the pixel signal VOUT at t813 of FIG. 8. At t813, it is assumed and described that the potential level of the first floating diffusion node FD1 is equal to a potential level 1240 of the second floating diffusion node FD2, according to the high-level H personal control signal DRG.

A potential level 1220 of the third floating diffusion node FD3 may have a potential level value close to the first potential ON1 based on the third control signal LSTG of the high-level H. The potential level 1240 of the second floating diffusion node FD2 may have a potential level value close to the first potential ON2 based on the first control signal STG of the high-level L. Since the photo charges generated from the first photoelectric element SPD are transmitted to the third floating diffusion node FD3 and the second floating diffusion node FD2, a potential level 1230 of the first photoelectric element SPD may be same as the potential level 1220 of the third floating diffusion node FD3 and the potential level 1240 of the second floating diffusion node FD2. A potential level 1250 of the reset voltage VDD may have a potential level value close to the second potential OFF3 based on the low-level L reset control signal RG.

Photo charges accumulated in the first capacitor MC may correspond to the entire area of the hatched portions. The threshold voltage of the third transfer gate LSTX, the first transfer gate STX, and the gain control transistor DRX may be lowered according to the third control signal LSTG of the high-level H, the first control signal STG of the high-level H, and the gain control signal DRG of the high-level H. Photo charges accumulated in the first capacitor MC may be transmitted to the third floating diffusion node FD3 through the third transfer gate LSTX. At this time, the potential level 1210 of the first capacitor MC may be equal to the potential level 1220 of the third floating diffusion node FD3.

Photo charges accumulated in the third floating diffusion node FD3 may be transmitted to the second floating diffusion node FD2 through the first transfer gate STX. Photo charges accumulated in the second floating diffusion node FD2 may be transmitted to the first floating diffusion node FD1 through the gain control transistor DRX.

The charge continuously accumulated in the first capacitor MC before t813 may be transmitted to the second to third floating diffusion nodes FD2 and FD3 after t813. The same amount of photo charges may be accumulated in the second to third floating diffusion nodes FD2 and FD3 to form the same potential levels 1220 and 1240. The potential levels 1220 and 1240 of the second to third floating diffusion nodes FD2 and FD3 may be output as the pixel signal VOUT of the image signal Vsig_MC for the first capacitor MC.

Figure 13:
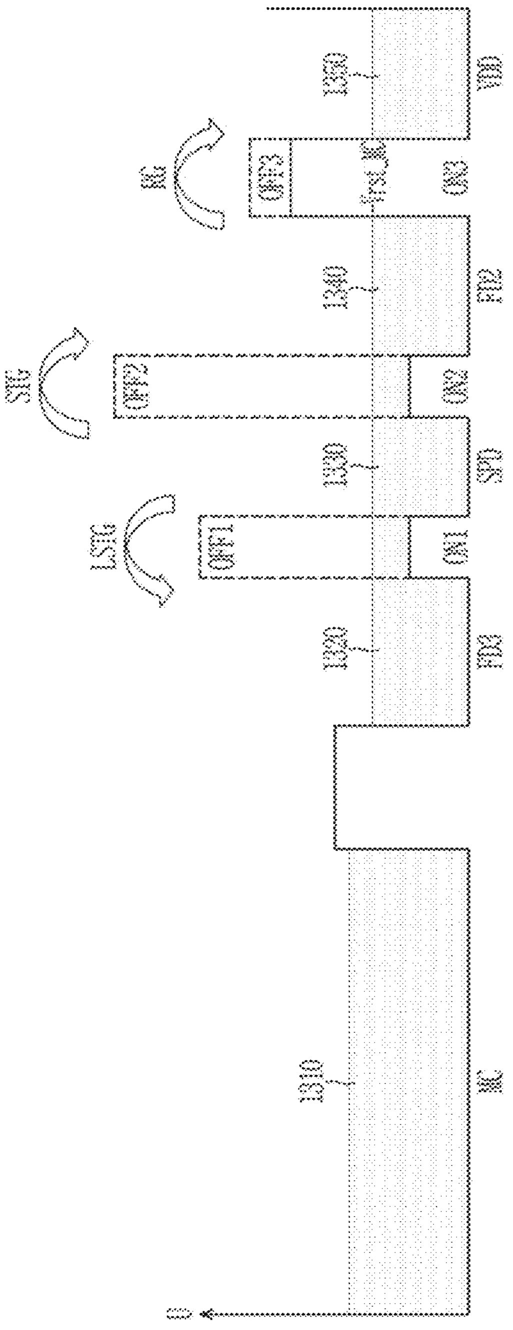
FIG. 13 illustrates the potential level for a floating diffusion node, etc. when the reset signal for the first capacitor is output as a pixel signal.

FIG. 13 illustrates the potential level for a floating diffusion node, etc. when the reset signal for the first capacitor is output as a pixel signal.

Specifically, FIG. 13 shows potential levels U of the first photoelectric element SPD, the second floating diffusion node FD2, the third floating diffusion node FD3, the first capacitor MC and the reset voltage source VDD when an image signal Vrst_MC for the first capacitor MC is output as the pixel signal VOUT at t815 of FIG. 8. At t815, it is assumed and described that the potential level of the first floating diffusion node FD1 is equal to a potential level 1340 of the second floating diffusion node FD2, according to the high-level H personal control signal DRG.

After t813, the reset control signal RG may transition from the low-level L to the high-level H, and at t815, the reset control signal RG may transition from the high-level H to the low-level L. After t813, a potential level 1350 of the reset voltage VDD may have a potential level value close to the first potential ON3 based on the high-level H reset control signal RG. At t815, the potential level 1350 of the reset voltage VDD may have a potential level value close to the second potential OFF3 based on the low-level L reset control signal RG.

After t813, the photo charge accumulated in the second floating diffusion node FD2 may be transmitted to the reset voltage source through the reset transistor RX. The reset voltage VDD receiving the photo charge from the second floating diffusion node FD2, the potential levels 1350, 1320, and 1340 of the third floating diffusion node FD3 and the second floating diffusion node FD2 may be the same. Since the photo charges accumulated in the second floating diffusion node FD2 and the third floating diffusion node FD3 are transmitted to the reset voltage source, the potential levels 1320 and 1340 of the second floating diffusion node FD2 and the third floating diffusion node FD3 may be lower than the potential level 1310 of the first capacitor MC.

Since the third control signal LSTG and the first control signal STG remain at a low-level, the photo charges generated from the first photoelectric element SPD may be transmitted to the third floating diffusion node FD3 and the first floating diffusion node FD1. A potential level 1330 of the first photoelectric element SPD may be the same as the potential level 1320 of the third floating diffusion node FD3 and the potential level 1340 of the second floating diffusion node FD2.

The potential levels 1320 and 1340 of the third floating diffusion node FD3 and the second floating diffusion node FD2 may be output as the pixel signal VOUT of the reset signal Vrst_MC for the first capacitor MC.

Figure 14:
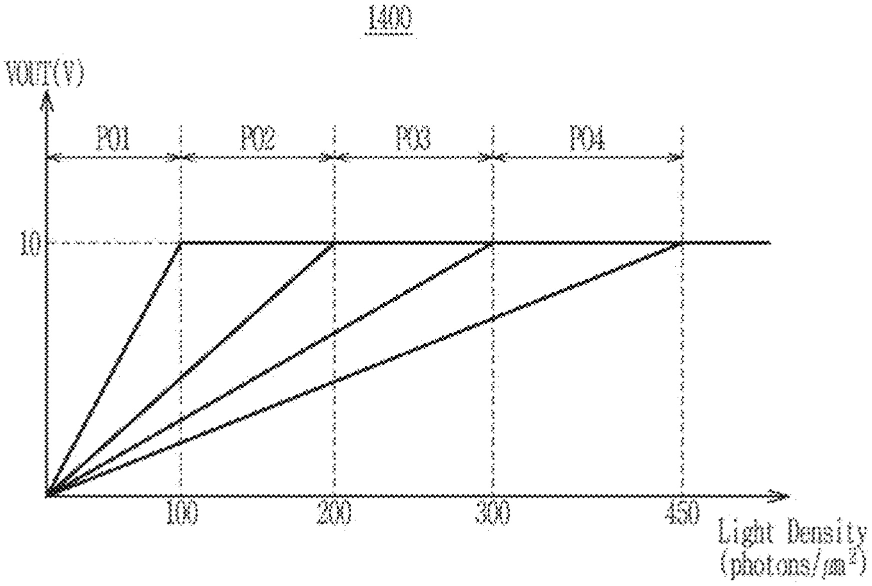
FIG. 14 illustrates pixel signals for the second photoelectric element, the first photoelectric element, and the first capacitor that change depending on the light density.

FIG. 14 illustrates pixel signals for the second photoelectric element, the first photoelectric element, and the first capacitor that change depending on the light density.

Referring to FIG. 12, as the light density increases, the voltage changes in the PO1 section, P02 section, P03 section, and P04 section may increase. Voltage changes may be determined based on the difference between the reset voltage of the pixel signal VDD and the sensing voltage. The pixel signal VOUT may have a charge equal to the full well capacity (FWC), which is the maximum amount of charge that each pixel PX may store. Even if more charge reaches the pixel PX than the maximum amount of charge that the pixel PX may store, no more charges may be stored in the pixel PX. For example, as the light density increases, the voltage changes in the PO1 section, P02 section, P03 section, and P04 section may increase, but may have a maximum value of 10V.

Referring to FIGS. 8 and 14, in the P01 section, a pixel signal in high conversion gain HCG mode for the second photoelectric element LPD may be output. The reset signal RST_H in high conversion gain HCG mode for the second photoelectric element LPD may be output at t803. At t805, the image signal SIG_H in high conversion gain HCG mode for the second photoelectric element LPD may be output. After t805, based on the subtraction of the reset signal RST_H and the image signal SIG_H of the high conversion gain HCG mode for the second photoelectric element LPD, the voltage change in the high conversion gain HCG mode may be output for the second photoelectric element LPD.

In the P02 section, a pixel signal in low conversion gain LCG mode for the second photoelectric element LPD may be output. At t801, a reset signal RST_L in low conversion gain LCG mode for the second photoelectric element LPD may be output. At t807, the image signal SIG_L in low conversion gain LCG mode for the second photoelectric element LPD may be output. After t807, based on the subtraction of the reset signal RST_L and the image signal SIG_L of the low conversion gain LCG mode for the second photoelectric element LPD, the voltage change in low conversion gain LCG mode may be output.

In the P03 section, a pixel signal for the first photoelectric element SPD may be output. At t809, the reset signal RST for the first photoelectric element SPD may be output, and at t811, the image signal SIG for the first photoelectric element SPD may be output. After t811, the voltage change for the first photoelectric element SPD may be output based on the subtraction of the reset signal RST and the image signal SIG for the first photoelectric element SPD.

In the P04 section, a pixel signal for the first capacitor MC may be output. At t813, the image signal SIG_MC for the first capacitor MC may be output, and at t815, the reset signal RST_MC for the first capacitor MC may be output. After t815, the voltage change for the first capacitor MC may be output based on the subtraction of the image signal SIG_MC and the reset signal RST_MC for the first capacitor MC.

Figure 15:
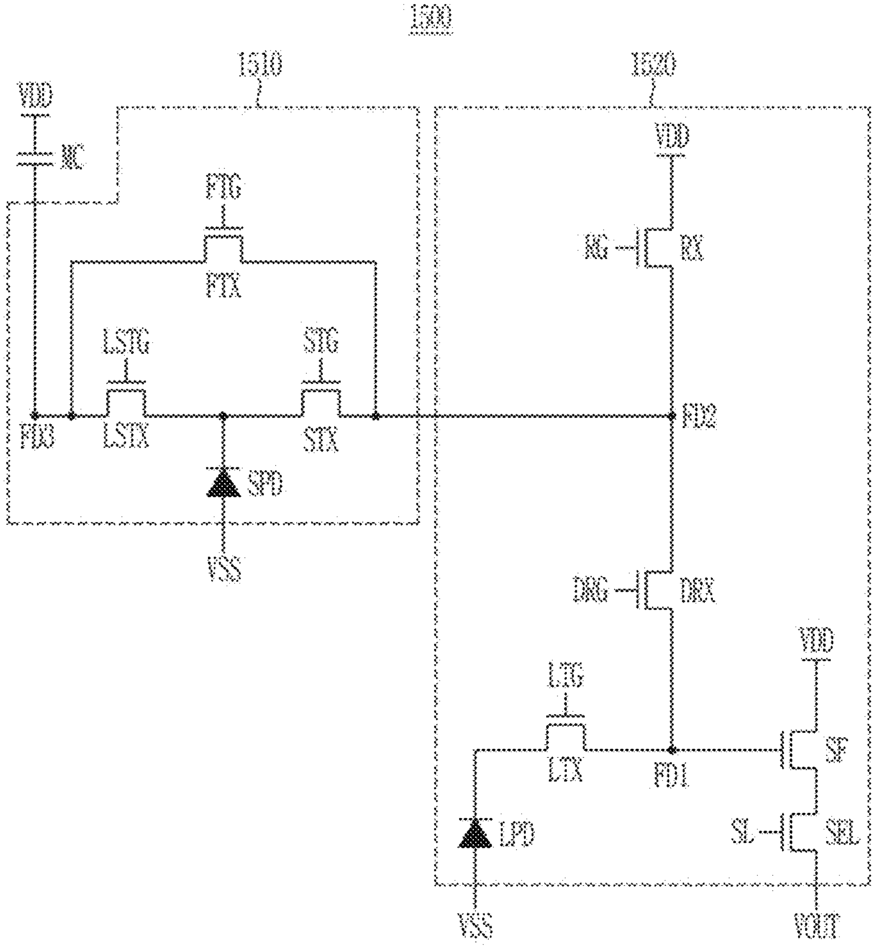
FIG. 15 is a circuit diagram of a pixel PX according to an example.

FIG. 15 is a circuit diagram of a pixel PX according to an example.

Specifically, FIG. 15 is a circuit diagram of the pixel PX of FIG. 1. Referring to FIG. 15, a pixel PX 1500 may include a first circuit 1510 and a second circuit 1520. The second circuit 1520 may have the same configuration as the second circuit diagram 520 of the pixel PX 500 in FIG. 5. The first circuit 1510 may have a different configuration from the first circuit diagram 510 of the pixel PX 500 of FIG. 5. The first circuit 1510 may include a first transistor FTX connected in parallel with the first transfer gate STX and the third transfer gate LSTX between the third floating diffusion node FD3 and the second floating diffusion node FD2.

The first transistor FTX may be turned on based on a control signal FTG. The photo charges accumulated in the first capacitor MC may be transmitted to the second floating diffusion node FD2 through the first path through the turned-on first transistor FTX. The photo charges accumulated in the first capacitor MC may be transmitted to the second floating diffusion node FD2 through the second path through the first transfer gate STX and the third transfer gate LSTX.

In some embodiments, photo charges accumulated in the first capacitor MC may be transmitted to the second floating diffusion node FD2 using the first path and the second path simultaneously. By transmitting photo charges to the second floating diffusion node FD2 using the first path and the second path, the photo charges accumulated in the first capacitor MC may be quickly transmitted to the second floating diffusion node FD2.

When the photo charges accumulated in the first capacitor MC are transmitted to the second floating diffusion node FD2 only through the second path, and when any false signal of the first control signal STG and the third control signal LSTG is generated, photo charges cannot be delivered to the second floating diffusion node FD2. However, since the first transistor FTX may be driven independently of the first control signal STG and the third control signal LSTG, the stability of the first circuit 1510 may increase compared to that of the first circuit 510.

Compared to the pixel PX 500 of FIG. 5, the pixel PX 1500 of FIG. 15 may easily read the photo charges accumulated in the first capacitor MC. Additionally, the image signal SIG_MC and the reset signal RST_MC of the pixel PX 1500 for the first capacitor MC may be measured more accurately and quickly compared to the pixel PX 500.

Figure 16:
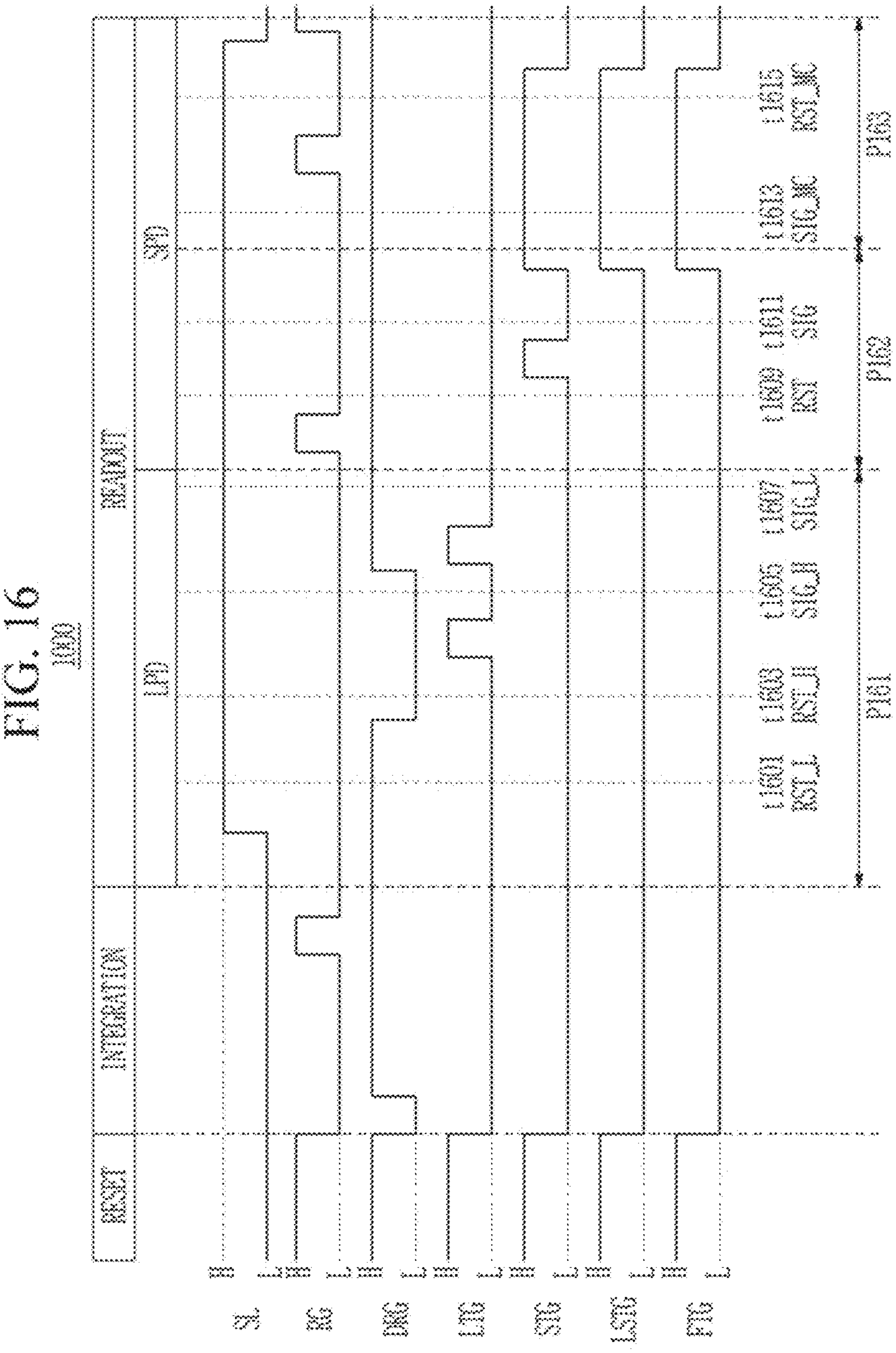
FIG. 16 is a timing diagram illustrating the operation of the pixel PX according to FIG. 15.

FIG. 16 is a timing diagram illustrating the operation of the pixel PX according to FIG. 15.

In FIG. 15, a scan section for driving a plurality of pixels PX on a row line basis may be shown. One scan section may sequentially include a reset section RESET, an integration section INTEGRATION, and a readout section READOUT. In the reset section RESET, integration section INTEGRATION, and readout section READOUT of FIG. 15, the logic level transitions of each of the selection control signal SL, the reset control signal RG, the gain control signal DRG, the first control signal STG, the second control signal STG, and the third control signal LSTG are the same as the timing diagram in FIG. 8. However, since the pixel PX according to FIG. 15 includes the first transistor FTX, the transition of the logic level of the control signal FTG of the first transistor FTX will be described.

In the reset period, since the control signal FTG of the first transistor FTX maintains a logic high level, the third floating diffusion node FD may be reset to the power supply voltage VDD. In the integration section INTEGRATION, the control signal FTG of the first transistor FTX may transition to the low-level L.

In the readout READOUT period, the control signal FTG of the first transistor FTX may transition to the high-level H after t1611. The photo charges accumulated in the first capacitor MC during the integration period may be transmitted to the second floating diffusion region FD2 through the third floating diffusion region FD3 and the turned-on first transistor FTX.

At t1613, an image signal corresponding to the first capacitor MC may be output through the column lines CL1, CL2, . . . , CLm−1. For example, the pixel signal output from t1613 is the image signal SIG_MC for the overflowed charge of the first photoelectric element SPD.

After t1613, the reset control signal RG may transition from the low-level L to the high-level H. At this time, the gain control signal DRG is at the high-level H, and the control signal FTG of the first transistor FTX is also maintained at the high-level H, so the first floating diffusion node FD1, the second floating diffusion node FD2, and the third floating diffusion node FD3 may be reset.

At t615, reset signals corresponding to the reset first floating diffusion node FD1, second floating diffusion node FD2, and third floating diffusion node FD3 may be output through the column lines CL1, CL2, . . . , CLm−1. For example, at t615, a reset signal RST_MC for the overflowed charge of the first photoelectric element SPD may be output as the pixel signal VOUT. After t1615, the control signal FTG of the first transistor FTX may transition from the high-level H to the low-level L.

Figure 17:
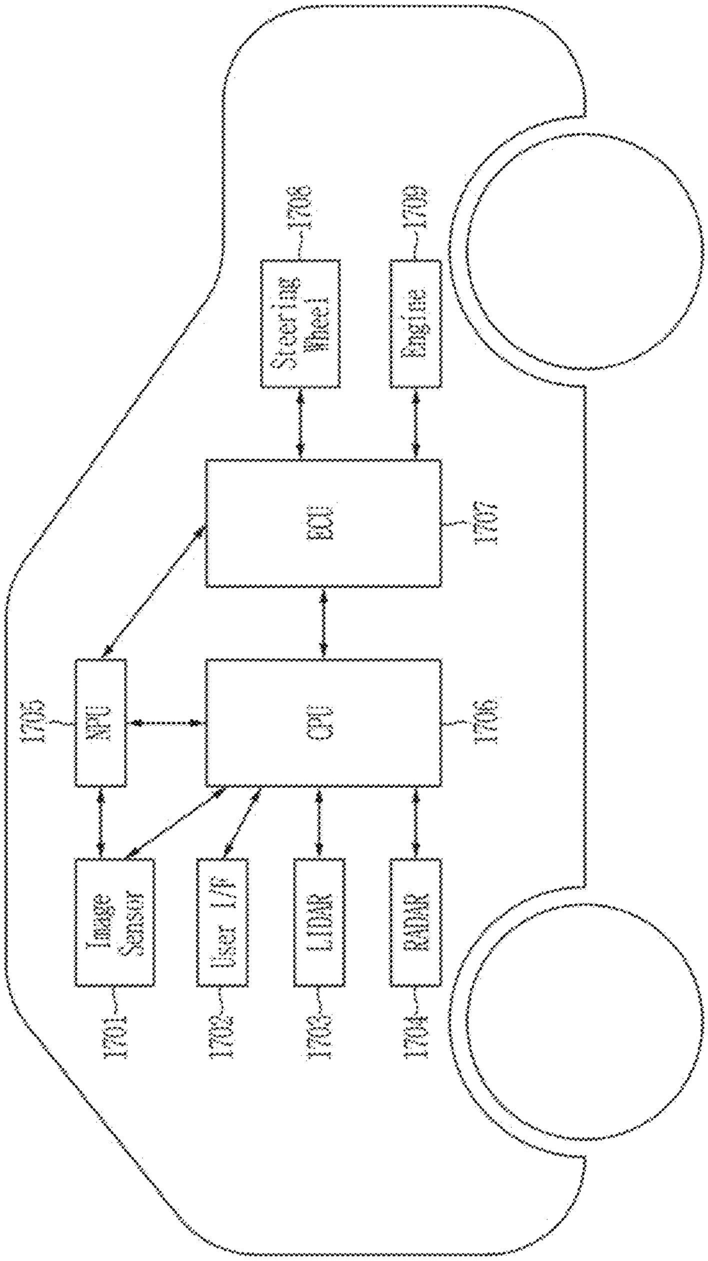
FIG. 17 is a block diagram illustrating a vehicle according to an example embodiment.

FIG. 17 is a block diagram illustrating a vehicle according to an example embodiment.

As shown in FIG. 17, a vehicle 1700 may include an image sensor 1701, a user interface 1702, a light detection and ranging (LIDAR) sensor 1703, a radio detection and ranging (RADAR) sensor 1704, a neural processing unit (NPU) 1705, a central processing unit (CPU) 1706, and an electronic control unit (ECU) 1707. The ECU 1707 may receive the steering angle and speed of the vehicle from a steering wheel 1708 and an engine 1709. In addition, although not shown, the vehicle 1700 may further include a communication module, an input/output module, a security module, a power control device, or the like, and may further include various types of control devices.

Here, the image sensor 1701 may be the image sensor described with reference to FIGS. 1 to 16, respectively.

In some embodiments, the vehicle 1700 may detect objects using information about the external environment obtained through sensors (e.g., the image sensor 1701, the lidar sensor 1703, and/or the radar sensor 1704). The sensors 1701, 1703, and 1704 may capture objects, measure and transmit distances to objects to processors (e.g., the CPU 1706, the NPU 1705, and the ECU 1707). In order for the sensors 1701, 1703, and 1704 to detect objects, in addition to the mentioned sensors, a time of flight (ToF) sensor, an ultrasonic sensor, an infrared sensor, a magnetic sensor, and a position sensor (e.g., GPS), an acceleration sensor, a barometric pressure sensor, a temperature/humidity sensor, a proximity sensor, and a gyroscope sensor may be further used.

The image sensor 1701 may provide image or light sensing, and may be, for example, a complementary metal-oxide-semiconductor (CMOS) image sensor. The image sensor 1701 may obtain image or visual information about an object. For example, the image sensor 1701 may be attached to the front of the vehicle to capture driving images or measure the distance to an object disposed in front of the vehicle. The position at which the image sensor 1701 is attached is not limited thereto, and the image sensor 1701 may be attached at various positions to achieve the intended purpose of obtaining information about objects.

The image sensor 1701 may capture images of the environment surrounding the vehicle 1700. The vehicle 1700 may include at least two image sensors to capture images around the vehicle in 360 degrees. In an embodiment, the image sensor 1701 may be equipped with a wide-angle lens. In an embodiment, four image sensors for the front, rear, left, and right sides of the vehicle may be included in the vehicle 1700. But the vehicle 1700 is not limited thereto, and the environment surrounding the vehicle may be captured using a single image sensor 1701. The image sensor 1701 may continuously provide information about the environment around the vehicle to the vehicle 1700 by continuously capturing images of the environment around the vehicle.

The image sensed by the image sensor 1701 may be processed by the CPU 1706 and/or NPU 1705. The CPU 1706 may detect objects by processing the sensed images in a motion-based method, and the NPU 1705 may detect objects by processing the sensed images in a shape-based method. The image sensor 1701 may be attached to the front of the vehicle and sense the external environment in front of the vehicle, but is not limited thereto, and may be attached to various surfaces of the vehicle to sense the external environment.

Here, the image sensor 1701 may transmit photo charges generated from a plurality of photoelectric elements and photo charges accumulated in a capacitor to a plurality of floating diffusion nodes in a high-illuminance and low-illuminance environment.

The user interface 1702 may include various electronic and mechanical devices included at or near the driver's seat or passenger's seat, such as a vehicle instrument panel, a display showing driving information, a navigation system, and an air conditioning system.

The LIDAR sensor 1703 may measure the distance to an object by emitting a laser pulse and receiving the laser reflected from the target object. The LIDAR sensor 1703 may generally include a laser, scanner, receiver, and positioning system. Lasers generally use light in the 600 to 1000 nm (nano meter) wavelength range, but this may vary depending on the application. A scanner may quickly obtain information about the surrounding environment by scanning the sensed surrounding environment, and various types of scanners using multiple mirrors may exist. The receiver may receive the laser pulse reflected by the target object, and detect and amplify photons from the laser pulse. The positioning system may check the position coordinates and direction of a device equipped with a receiver to implement a 3D image. The LIDAR sensor 1703 and the RADAR sensor 1704 may be classified according to the effective measurement distance.

The RADAR sensor 1704 may emit electromagnetic waves and receive electromagnetic waves reflected from the target object to measure the distance to the object, or may identify the object, and measure the position and moving speed of the object. The RADAR sensor 1704 may include a transmitter and a receiver. The transmitter may generate and output electromagnetic waves, and the receiver may process the signal by receiving echo waves reflected from the target object. The RADAR sensor 1703 may transmit and receive through one antenna, but is not limited thereto. The frequency bandwidth of the electromagnetic wave used in the RADAR sensor 1704 is a radio wave or a microwave band, but may be changed depending on the purpose. In an embodiment, the LIDAR sensor 1703 and the RADAR sensor 1704 may be attached to a vehicle to assist in determining the relative positional relationship between the vehicle and an object of interest. The RADAR sensor 1704 may be divided into a long radar sensor and a short radar sensor.

The NPU 1705 may receive input data, perform operations using an artificial neural network, and provide output data based on the operation results. The NPU 1705 may be a processor optimized for simultaneous matrix operations, may process multiple operations in real time, and may derive optimal values by learning on its own based on accumulated data. The NPU 1705 is optimized for simultaneous matrix operations and may process multiple operations in real time, and may learn on its own based on accumulated data to derive local-maximum values from the current driving parameters.

In an exemplary embodiment, the NPU 1705 may be a specialized processor to perform a deep-learning algorithm. For example, the NPU 1705 may be a specialized processor to perform a deep-learning algorithm. For example, the NPU 1705 may process operations based on various types of networks, such as a convolution neural network (CNN), region with convolution neural network (R-CNN), region proposal network (RPN), recurrent neural network (RNN), fully convolutional network, long short-term network (LSTM), and classification network. However, it is not limited thereto, and various types of operational processing that mimic human neural network are possible.

The NPU 1705 may receive a driving image from the image sensor 1701 and perform shape-based object detection based on the driving image. The NPU 1705 may distinguish each of the plurality of objects in the driving image by extracting the features of the plurality of objects and learning the features on its own based on accumulated data. For example, the NPU 1705 may extract objects that are criteria for driving, such as vehicles, pedestrians, traffic lights, and lanes, from a single driving image based on the features determined by using the accumulated data as learning material.

The CPU 1706 controls the overall operation of the vehicle 1700. The CPU 1706 may include one processor core (Single Core) or may include a plurality of processor cores (Multi-Core). The CPU 1706 may process or execute programs and/or data stored in memory. For example, the CPU 1706 may control the functions of the NPU 1705 and the ECU 1707 by executing programs stored in memory.

The CPU 1706 may obtain the steering angle and vehicle speed from the ECU 1707. The steering angle may be determined by the driver's operation of the steering wheel 1708, processed by the ECU 1707, which manages the operation of the steering control device, and provided to the CPU 1706. Vehicle speed may be measured based on at least one of the driver's pedaling (e.g., operation of the accelerator), the rotational speed of the engine 1709, and the wheel speed measured by the wheel sensor, and may be processed at the ECU 1707, which controls the speed of the vehicle, and provided to the CPU 1706.

In addition, the CPU 1706 may determine the relative positional relationship between the vehicle and surrounding vehicles, issue instructions to maintain the number of rotations of the engine 1709 for constant speed driving, in order to maintain a constant distance from surrounding vehicles according to a determined driving plan. When the vehicle and surrounding vehicles are within a threshold distance, or when the surrounding vehicles are cutting in, instructions to adjust the steering wheel 1708 left and right to change the steering angle in order to perform evasion maneuvers may be issued. In FIG. 19, the steering wheel 1708 and the engine 1709 are disclosed as configurations related to the steering angle and vehicle speed, but the steering angle and vehicle speed are not limited thereto and may be determined through various vehicle parts.

The CPU 1706 may perform motion-based object detection in driving images. The motion-based method is a method of determining relative movement by detecting the degree of movement of an object over time. Driving images may be continuously obtained for each frame through the image sensor 1701. For example, each frame may be captured at a speed of 60 fps (frame per second), and thus the CPU 1706 may detect movement between image frames obtained every 1/60 second over time. The motion-based method may include optical flow, which refers to the distribution of the motion vector of the object.

In addition to the image sensor 1701, the CPU 1706 may stably maintain the driving state of the vehicle by auxiliary use of the distance to the object obtained from the LIDAR sensor 1703 and the RADAR sensor 1704. Additionally, the CPU 1706 may issue instructions to adjust the conditions inside and outside the vehicle according to the driver's manipulation of the user interface 1702.

The ECU 1707 may be an electronic control device designed to control the overall operation or part of the operation of the vehicle. The ECU 1707 may control vehicle operation according to operation of the combustion engine, the operation of one or more electric motors, and the operation of a semi-automatic gearbox (SAGB) or an automatic gearbox (AGB), or other parameters of the vehicle under the control of the driver, through a controller area network (CAN) multiplexing bus.

The ECU 1707 may electronically control the engine of the vehicle, steering control actuator, shift control system, anti-lock brake system, airbag control system, etc. with a computer, may provide the vehicle's speed to the vehicle 1700 based on the engine's rotational speed or the wheel speed measured by the wheel sensor, and may provide the vehicle's steering angle to the vehicle 1700 from the steering control device.

According to embodiments, the ECU 1707 may adjust the state of the steering wheel 1708 and the engine 1709 based on instructions issued by the CPU 1706 and the NPU 1705. In an embodiment, the ECU 1707 may accelerate or decelerate the vehicle according to instructions issued by the CPU 1706 and NPU 1705, and provide a signal to increase/decelerate the engine rotational speed to the engine 1709 for acceleration/deceleration. In addition, the ECU 1707 may change the steering wheel 1708 left and right for evasion maneuver when the distance to the surrounding vehicles is within a threshold distance according to a set driving plan, or in the case of cut-in by the surrounding vehicles.

According to an embodiment of the present disclosure, the CPU 1706 or the ECU 1707 may check for a defective ramp signal RML is defective and exit the autonomous driving mode of the vehicle 1700. For example, the CPU 1706 or ECU 1707 may check for a defective ramp signal RAMP while driving in an autonomous driving mode based on the image sensor 1701, and then immediately switch from autonomous driving mode to manual driving mode by the driver, ensuring user safety.

For example, the vehicle 1700 may check for the defective ramp signal RAMP and stop the driving assistance function based on the ramp signal RAMP, thereby ensuring the safety of the driver or user.

The ECU (e.g., ECU 1707) is shown in the drawing as being provided in the vehicle separately from the CPU 1706, but it is not limited thereto, and the vehicle control function of the ECU 1707 may be performed together while being included inside the CPU 1706. In this case, the CPU 1706 may be understood as having at least two processor cores (multi-core). In FIG. 19, the ECU 1707 is shown as a separate component from the CPU 1706, but is not limited thereto and may exist inside the CPU 1706.

Although not shown in FIG. 17, the vehicle 1700 may further include a communication module. The communication module may transmit data to the outside of the vehicle 1700 or receive data from the outside. For example, the communication module may perform communication with an external object of the vehicle 1700. In this case, the communication module may perform communication in the V2X (Vehicle to Everything) method. For example, the communication module may perform communication in V2V (Vehicle to Vehicle), V2I (Vehicle to Infra), V2P (Vehicle to Pedestrian), and V2N (Vehicle to Nomadic Devices) methods. However, the present disclosure is not limited thereto, and the communication module may transmit and receive data using various known communication methods. For example, the communication module may perform communication by, for example, 3G, 4G (LTE), 5G, Wi-Fi, Bluetooth, bluetooth low energy (BLE), Zigbee, near field communication (NFC), and ultrasonic wave communication, and may support both short-distance and long-distance communication.

While the embodiments of the present disclosure have been described in detail, it is to be understood that the disclosure is not limited to the disclosed embodiments, but on the contrary, is intended to cover various modifications and equivalent arrangements included within the spirit and scope of the appended claims.

What is claimed is:

1. An image sensor, comprising:

a first photoelectric element;

a first floating diffusion in which charges generated in the first photoelectric element are stored;

a second floating diffusion in which charges generated in the first photoelectric element are stored;

a first transfer gate, one end of which is connected to the first floating diffusion and the other end of which is connected to the first photoelectric element;

a first capacitor connected to the first floating diffusion;

a pixel including a second transfer gate with one end connected to the second floating diffusion and the other end connected to the first photoelectric element; and a row driver configured to apply a first control signal to the first transfer gate and a second control signal to the second transfer gate.

2. The image sensor of claim 1, wherein the pixel comprises a reset transistor with one end connected to the second floating diffusion and the other end receiving a reset voltage from a reset voltage source, a gain control transistor with one end connected to a third floating diffusion and the other end connected to the second floating diffusion, a driving transistor including a gate configured to receive a voltage of the third floating diffusion, and a selection transistor connected to the driving transistor to output a pixel voltage, and wherein the row driver is further configured to apply a reset control signal to the reset transistor, apply a gain control signal to the gain control transistor, and apply a selection control signal to the selection transistor.

3. The image sensor of claim 2, wherein the pixel further comprises a second photoelectric element, and a third transfer gate with one end connected to the second photoelectric element and the other end connected to the third floating diffusion, and wherein the row driver is further configured to apply a third control signal to the third transfer gate.

4. The image sensor of claim 3, wherein the row driver is further configured to:

apply the selection control signal at a low level during a first period, and apply the reset control signal, the gain control signal, the first control signal, the second control signal, and the third control signal at a high level, apply the reset control signal, the gain control signal, the first control signal, the second control signal, and the third control signal at a low level in a first part within a second period, and apply the reset control signal and the gain control signal at a high level in a second part after the first part within the second period, and apply the selection control signal at a high level so that a reset signal for the first photoelectric element is output in a first part within a third period, apply the reset control signal at a low level so that an image signal for the first photoelectric element is output, and apply the second control signal at a high level.

5. The image sensor of claim 4, wherein the row driver is further configured to apply the first control signal at a high level so that an image signal for the first capacitor is output in a second part within the third period after the first part within the third period, and apply the reset control signal at a high level so that a reset signal for the first capacitor is output.

6. The image sensor of claim 5, wherein the row driver is further configured to:

apply the selection control signal at a high level so that a reset signal of a low conversion gain mode for the second photoelectric element is output, apply the gain control signal at a low level so that a reset signal of a high conversion gain mode for the second photoelectric element is output, apply the third control signal at a high level so that an image signal of the high conversion gain mode for the second photoelectric element is output, and apply the gain control signal at a high level so that an image signal of the low conversion gain mode for the second photoelectric element is output, in an initial part before the first part within the third period.

7. The image sensor of claim 3, wherein the pixel further comprises a first transistor connected in parallel with the first transfer gate and the third transfer gate between the first floating diffusion and the second floating diffusion, and wherein the row driver is further configured to apply a fourth control signal controlling the first transistor.

8. The image sensor of claim 7, wherein the row driver is further configured to:

apply the selection control signal at a low level during a first period, and apply the reset control signal, the gain control signal, the first control signal, the second control signal, the third control signal, and the fourth control signal at a high level, apply the reset control signal, the gain control signal, the first control signal, the second control signal, the third control signal, and the fourth control signal at a low level in a first part within a second period, and apply the reset control signal and the gain control signal at a high level in a second part after the first part within the second period, apply the selection control signal at a high level so that a reset signal for the first photoelectric element is output in a first part within a third period, apply the reset control signal at a low level so that an image signal for the first photoelectric element is output, and apply the second control signal at a high level, and apply the first control signal at a high level so that an image signal for the first capacitor is output in a second part after the first part within the third period, and apply the reset control signal at a high level so that a reset signal for the first capacitor is output.

9. The image sensor of claim 1, wherein the first capacitor comprises a lateral overflow integration capacitor (LOFIC).

10. The image sensor of claim 1, wherein the first transfer gate comprises one vertical transfer gate, and the second transfer gate comprises two vertical transfer gates.

11. A pixel provided within an image sensor, comprising:

a first region configured to receive photo charges generated in a first photoelectric element through a first transfer gate;

a first capacitor configured to receive the photo charges from the first region through a first contact connected to the first region;

a second region configured to receive the photo charges generated in the first photoelectric element through a second transfer gate;

a third region configured to receive the photo charges from the second region through a second contact connected to the second region;

a reset transistor connected to one end of the third region and a gain control transistor connected to the other end of the third region; and a fourth region configured to receive photo charges generated in a second photoelectric element through a third transfer gate connected to the gain control transistor.

12. The pixel provided within the image sensor of claim 11, wherein the first photoelectric element, the first transfer gate, the second transfer gate, the first region, and the second region are included in a first pixel region, and a second pixel region connected to the first pixel region through the second contact comprises the second photoelectric element, the gain control transistor, the reset transistor, the third region, and the fourth region.

13. The pixel provided within the image sensor of claim 12, wherein the first pixel region and the second pixel region are separated from each other based on a pixel isolation pattern.

14. The pixel provided within the image sensor of claim 11, further comprising:

an interconnection connecting the second contact connected to the second region and a third contact connected to the third region; and an interconnection insulating layer made of a material with a lower dielectric constant than silicon oxide and formed surrounding the interconnection.

15. The pixel provided within the image sensor of claim 14, wherein the third region is further configured to receive photo charges from the second region through an interconnection connected to the second contact and the third contact, the second contact, and the third contact.

16. The pixel of claim 11, wherein the first transfer gate comprises one vertical transfer gate, and the second transfer gate comprises two vertical transfer gates, and wherein when first and second control signals applied to each of the first transfer gate and the second transfer gate are at low level, photo charges generated in the first photoelectric element are transmitted to the first region.

17. The pixel of claim 16, wherein the first transfer gate and the second transfer gate are further configured to receive the first control signal and the second control signal from a fourth contact connected to each of the first transfer gate and the second transfer gate.

18. A driving method of an image sensor, comprising:

transmitting photo charges generated from a second photoelectric element to a first node;

generating a first pixel signal in response to a voltage of the first node;

transmitting photo charges generated from a first photoelectric element to the first node;

generating a second pixel signal in response to the voltage of the first node;

transmitting the stored photo charges from a first capacitor storing the photo charges overflowing from the first photoelectric element to the first node; and generating a third pixel signal in response to the voltage of the first node.

19. The driving method of the image sensor of claim 18, wherein the generating of the first pixel signal in response to the voltage of the first node comprises:

generating the first pixel signal based on a gain control signal configured to apply to a gain control transistor connected between the first node and a second node connected to the first node.

20. The driving method of the image sensor of claim 19, wherein the generating of the first pixel signal based on the gain control signal comprises:

generating a pixel signal in response to a voltage of the first node connected through the gain control transistor turned off based on the gain control signal at a low level; and transitioning the gain control signal to a high level, and generating a pixel signal in response to the voltage output from each of the first node and the second node connected through the gain control transistor turned on based on the gain control signal of the high level.

* * * * *